(12) United States Patent
Zhang

(10) Patent No.: US 12,462,734 B2
(45) Date of Patent: Nov. 4, 2025

(54) DISPLAY PANEL AND DISPLAY DEVICE

(71) Applicant: Wuhan Tianma Micro-Electronics Co., Ltd., Wuhan (CN)

(72) Inventor: Wenshuai Zhang, Wuhan (CN)

(73) Assignee: Wuhan Tianma Micro-Electronics Co., Ltd., Wuhan (CN)

( * ) Notice: Subject to any disclaimer, the term of this patent is extended or adjusted under 35 U.S.C. 154(b) by 0 days.

(21) Appl. No.: 18/625,145

(22) Filed: Apr. 2, 2024

(65) Prior Publication Data

US 2025/0218343 A1     Jul. 3, 2025

(30) Foreign Application Priority Data

Jan. 2, 2024  (CN) .......................... 202410004904.5

(51) Int. Cl.
*G09G 3/32* (2016.01)
*G09G 3/3266* (2016.01)
*G11C 19/28* (2006.01)

(52) U.S. Cl.
CPC ............. *G09G 3/32* (2013.01); *G09G 3/3266* (2013.01); *G11C 19/28* (2013.01); *G09G 2300/0809* (2013.01); *G09G 2310/0267* (2013.01); *G09G 2310/0286* (2013.01); *G09G 2310/08* (2013.01); *G09G 2340/0435* (2013.01)

(58) Field of Classification Search
CPC .... G11C 19/28; G11C 19/287; G09G 3/3677; G09G 3/3674; G09G 3/3266; G09G 2310/08; G09G 2310/0286; G09G 3/32
See application file for complete search history.

(56) References Cited

U.S. PATENT DOCUMENTS

2022/0076618 A1 * 3/2022 Lai ........................ G09G 3/3266
2024/0386840 A1 * 11/2024 Lai ........................... G09G 3/32

FOREIGN PATENT DOCUMENTS

| CN | 108461062 B | * | 7/2021 | ............... G09G 3/20 |
| CN | 114648947 A |   | 6/2022 | |
| CN | 116363982 A |   | 6/2023 | |

* cited by examiner

*Primary Examiner* — Xuemei Zheng
(74) *Attorney, Agent, or Firm* — Anova Law Group, PLLC

(57) ABSTRACT

A display panel and a display device are provided. The display panel includes a driving circuit including a plurality of cascaded shift registers configured to generate a primary scanning signal; and a plurality of gating circuits corresponding to the plurality of shift registers, electrically connected to corresponding shift registers, and configured to generate a scanning signal. A first input terminal of a gating circuit of the plurality of gating circuits is connected to a frequency cut signal, the gating circuit is configured to control a frequency of the scanning signal in response to the frequency cut signal, and the frequency of the scanning signal is less than or equal to a frequency of the primary scanning signal.

12 Claims, 16 Drawing Sheets

DISPLAY PANEL AND DISPLAY DEVICE

CROSS-REFERENCE TO RELATED APPLICATION

This application claims the priority of Chinese Patent Application No. 202410004904.5, filed on Jan. 2, 2023, the content of which is incorporated by reference in its entirety.

TECHNICAL FIELD

The present disclosure generally relates to the field of display technologies and, more particularly, relates to a display panel and a display device.

BACKGROUND

At present, display technologies are widely used in the display of televisions, mobile phones and public information, bringing great convenience to people's daily life and work. Display panels used to display images need to use a scan driving circuit to provide driving signals to the pixel circuit to control the display panel to implement the scan function such that the image data input to the display panel can be refreshed in real-time to realize dynamic display.

With the development of display technologies and hardware technologies, display panels are becoming larger and larger. At the same time, to make full use of the display panel, the split-screen display function is proposed, that is, different display areas on the same display panel display different operation interfaces at the same time, for example, one area displays news, some areas display videos, or different game perspectives are displayed in different areas. Accordingly, to reduce power consumption, different areas in the display panel can be driven at different frequencies. However, current display panels cannot drive different areas at different frequencies. The present disclosed display panel and display device are direct to solve one or more problems set forth above and other problems in the arts.

SUMMARY

One aspect of the present disclosure provides a display panel. The display panel includes a driving circuit including a plurality of cascaded shift registers configured to generate a primary scanning signal; and a plurality of gating circuits corresponding to the plurality of shift registers, electrically connected to corresponding shift registers, and configured to generate a scanning signal. A first input terminal of a gating circuit of the plurality of gating circuits is connected to a frequency cut signal, the gating circuit is configured to control a frequency of the scanning signal in response to the frequency cut signal, and the frequency of the scanning signal is less than or equal to a frequency of the primary scanning signal.

Another aspect of the present disclosure provides a display device. The display device may include a display panel. The display panel includes a driving circuit including a plurality of cascaded shift registers configured to generate a primary scanning signal; and a plurality of gating circuits corresponding to the plurality of shift registers, electrically connected to corresponding shift registers, and configured to generate a scanning signal. A first input terminal of a gating circuit of the plurality of gating circuits is connected to a frequency cut signal, the gating circuit is configured to control a frequency of the scanning signal in response to the frequency cut signal, and the frequency of the scanning signal is less than or equal to a frequency of the primary scanning signal.

Other aspects of the present disclosure can be understood by those skilled in the art in light of the description, the claims, and the drawings of the present disclosure.

BRIEF DESCRIPTION OF THE DRAWINGS

To illustrate the technical solutions in the embodiments of the present disclosure more clearly, the following briefly introduces the accompanying drawings used in the description of the embodiments. Obviously, the accompanying drawings in the following description are only some embodiments of the present disclosure, for those of ordinary skill in the art, other drawings can also be obtained from these drawings without creative effort.

DETAILED DESCRIPTION

Figure 1:
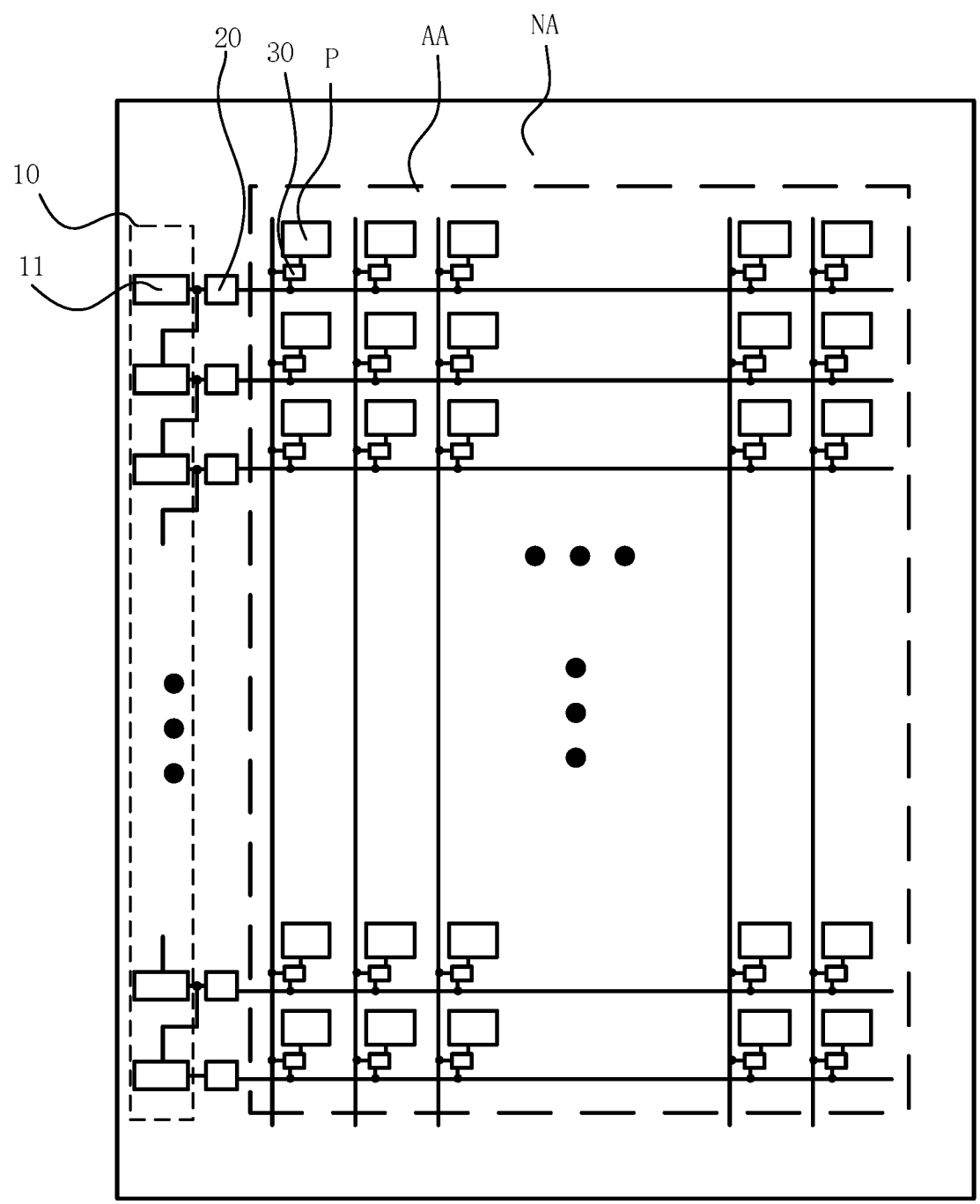
FIG. 1 illustrates an exemplary display panel according to various disclosed embodiments of the present disclosure.

Various exemplary embodiments of the present disclosure will now be described in detail with reference to the accompanying drawings. It should be noted that the relative arrangement of components and steps, numerical expressions and numerical values set forth in these examples do not limit the scope of the disclosure unless otherwise specifically stated.

The following description of at least one exemplary embodiment is merely illustrative in nature and is in no way intended to limit the disclosure, its application or uses.

Techniques, methods and devices known to those of ordinary skill in the relevant art may not be discussed in detail, but where appropriate, such techniques, methods and devices should be considered a part of the specification.

In all examples shown and discussed herein, any specific values are to be construed as illustrative only and not as limiting. Accordingly, other examples of the exemplary embodiments may have different values.

It should be noted that similar reference numerals and letters refer to similar items in the following figures such that once an item is defined in one figure, it does not require further discussion in subsequent figures.

Figure 2:
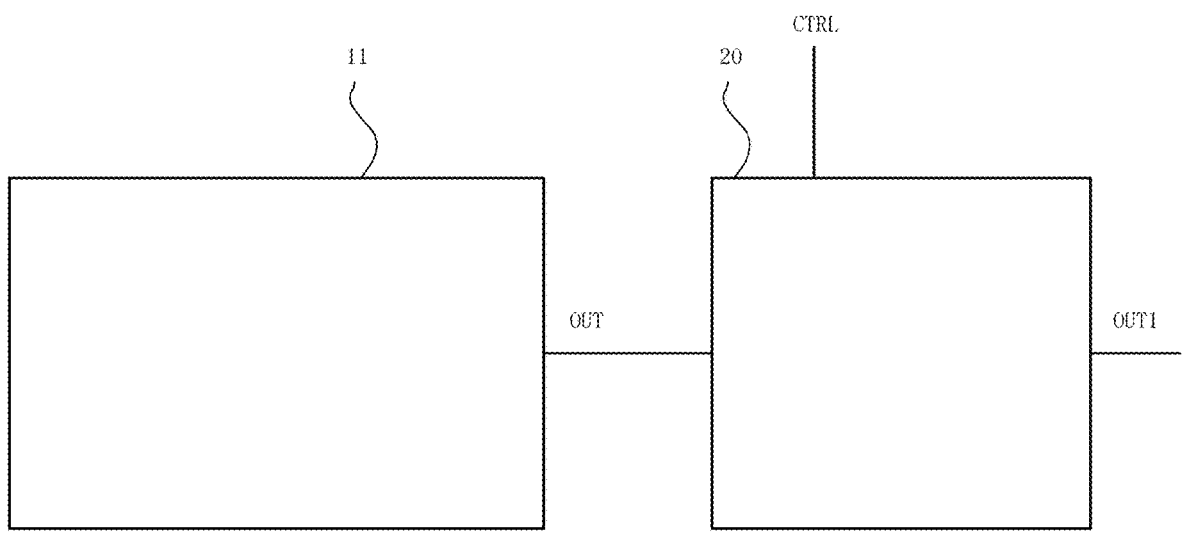
FIG. 2 illustrates an exemplary frame structure of a shift register and a gating circuit according to various disclosed embodiments of the present disclosure.

The present disclosure provides a display panel and a display device. FIG. 1 is a schematic plan view of an exemplary display panel according to various disclosed embodiments of the present disclosure. FIG. 2 is a schematic structural diagram of an exemplary frame structure of a shift register and a gating circuit according to various disclosed embodiments of the present disclosure.

As shown in FIGS. 1-2, the display panel may include a driving circuit 10. The driving circuit may include a plurality of cascaded shift registers 11. The shift registers 11 may be configured to generate the primary scanning signal OUT.

The display panel may also include a plurality of gating circuits 20. The gating circuits 20 may correspond to the plurality of shift registers 11. The gating circuits 20 may be electrically connected to the corresponding shift registers 11. The gating circuits 20 may be configured to generate the scanning signal OUT1.

The first input terminal of the gating circuit 20 may be connected to the frequency cut signal CTRL, and the gating circuit 20 may be used to control the frequency of the scanning signal OUT1 in response to the frequency cut signal CTRL. The frequency of the scanning signal OUT1 may be less than or equal to the frequency of the primary scanning signal OUT.

Specifically, one embodiment of the present may provide a display panel. The display panel may include a driving circuit 10. The driving circuit 10 may include a plurality of cascaded shift registers 11. The shift registers 11 may be configured to generate a primary scanning signal OUT.

Display panels usually directly provide driving signals to the pixel circuit through a shift register, that is, the shift register directly provides the primary scanning signal to the pixel circuit. Accordingly, the frequencies of the primary scanning signals received by each area in the display panel are same, and the split-screen display of the display panel cannot be realized.

The display panel provided by the present disclosure may also include a plurality of gating circuits 20. The gating circuits 20 may correspond to the shift registers 11, and the gating circuits 20 may be electrically connected to the corresponding shift registers 11. The input terminal of the gating circuit 20 may be connected to the frequency cut signal CTRL, and the frequency of the scanning signal OUT1 may be controlled by adjusting the frequency cutting signal CTRL such that the frequency of the scanning signal OUT1 may be less than or equal to the frequency of the primary scanning signal OUT. When the frequency of the scanning signal OUT1 of each gating circuit 20 in the display panel is equal to the frequency of the primary scanning signal OUT, the refresh frequency of each area in the display panel may be same, and the display panel may perform the normal display. When the frequency of the scanning signal OUT1 of a partial number of gating circuits 20 in the display panel is equal to the frequency of the primary scanning signal OUT, and the frequency of the scanning signal OUT1 of a partial number of gating circuit 20 is smaller than the frequency of the primary scanning signal OUT, the display panel may achieve different refresh frequencies in the different regions, that is, the display panel may achieve the split-screen display.

In the display panel provided the present disclosure, switching the between conventional display and the split-screen display may be realized by adjusting the frequency switching signal CTRL, and the switching method may be relatively simple. At the same time, the refresh frequency of each region in the display panel may be controlled by adjusting the frequency cut signal CTRL to enrich the functions of the display panel.

Further, referring to FIGS. 1-2, in some embodiments, the display panel may include a display area AA and a non-display area NA surrounding the display area AA. The display area AA may include multiple rows of pixel circuits 30.

The driving circuit 10 and the gating circuit 20 may both be located in the non-display area NA. In the driving circuit 10, the first-level shift registers 11 may provide the scanning signal OUT1 to at least one row of pixel circuits 30 through the gating circuit 20 electrically connected thereto.

Specifically, the display panel may include a display area AA and a non-display area NA surrounding the display area AA. The display area AA may be configured for display, and the non-display area NA may not be used for display and may be used to set up circuits and other structures. The driving circuit 10 and the gating circuit 20 may be both located in the non-display area NA. In the driving circuit 10, the first-level shift register 11 may provide the scanning signal OUT1 to at least one row of pixel circuits 30 through the gating circuit 20 electrically connected to it such that the pixel circuit 30 may control the light emission of the pixel P electrically connected thereto.

It should be noted that FIG. 1 only takes the structure of a display panel as an example. FIG. 1 exemplarily shows that the driving circuit 10 and the gate circuit 20 are located on one side of the display panel. In other embodiments of the present disclosure, the driving circuit 10 and the gating circuit 20 may also be located on both sides of the display panel, which will not be described here.

Figure 3A:
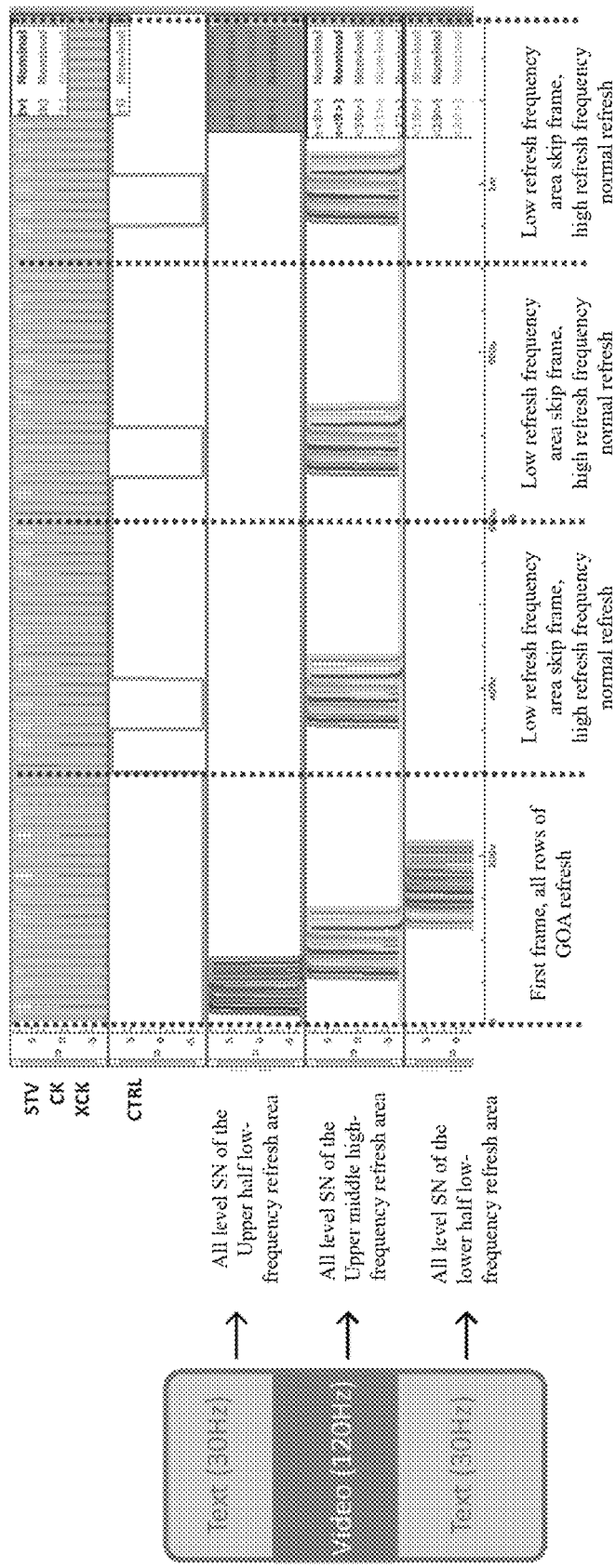
FIG. 3A illustrates an exemplary time sequence when a display panel is at a second display mode according to various disclosed embodiments of the present disclosure.
Figure 3B:
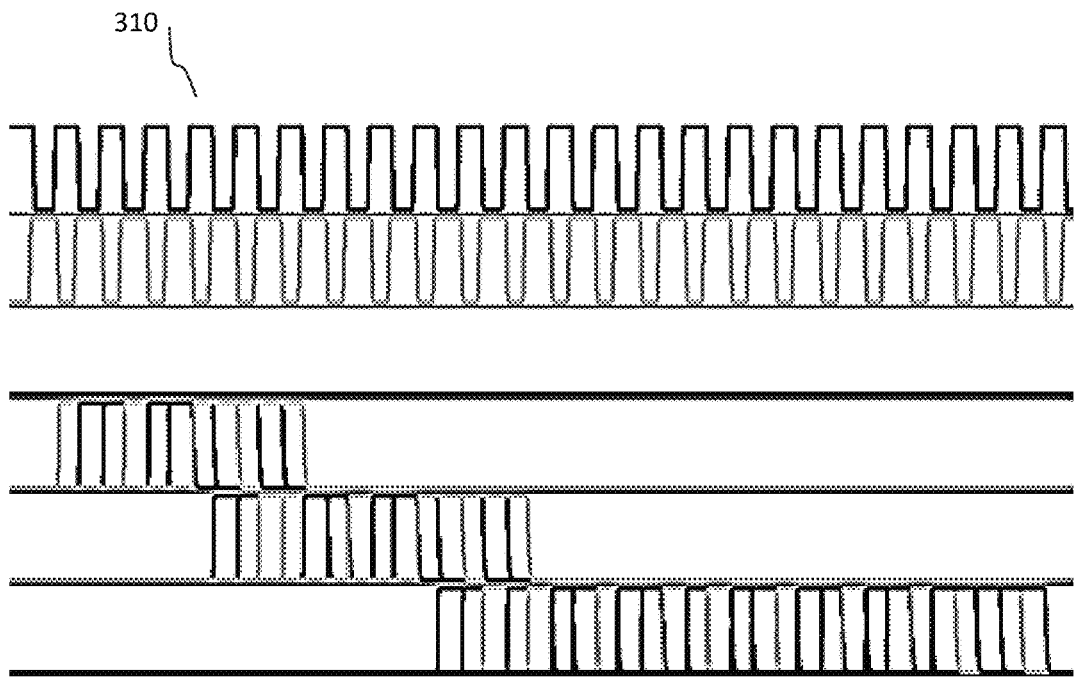
FIG. 3B illustrates an exemplary time sequence of an enlarged refresh frame of FIG. 3A when the display panel is at the second display mode according to various disclosed embodiments of the present disclosure.
Figure 3C:
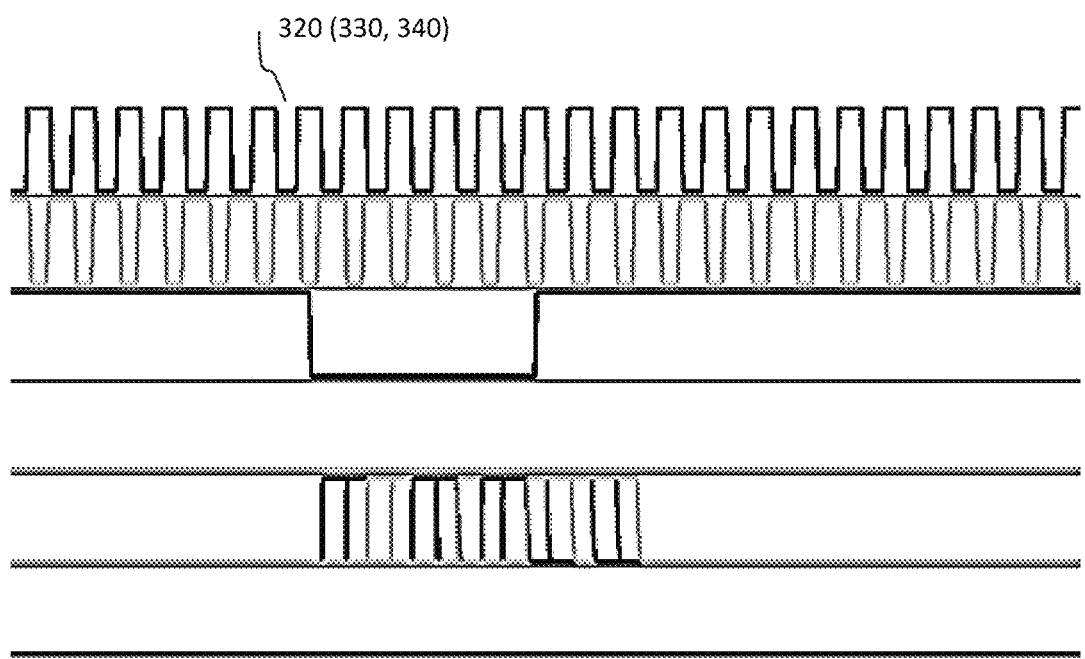
FIG. 3C illustrates an exemplary time sequence of an enlarged non-refresh frame of FIG. 3A when the display panel is at the second display mode according to various disclosed embodiments of the present disclosure.

FIG. 3A is an exemplary time sequence of the display panel provided by the present disclosure in a second display mode. As shown in FIG. 3A, the exemplary time sequence of the display panel includes a refresh frame 310 (first frame, all rows of GOA refresh), and three non-refresh frames 320, 330, 340 (low refresh frequency area skip frame, high refresh frequency normal refresh). FIG. 3B illustrates an exemplary time sequence of an enlarged refresh frame 310 of the display panel of FIG. 3A provided by the present disclosure in the second display mode. FIG. 3C illustrates an exemplary time sequence of an enlarged non-refresh frame 320 (330, 340) of the display panel of FIG. 3A provided by the present disclosure in the second display mode. As shown in FIGS. 1, 3A, 3B and 3C, in some embodiments, the display panel may have a first display mode and a second display mode.

In the first display mode, in each display frame, the potential of the frequency cut signal CTRL may be same. In the second display mode, in at least one display frame, the potential of the frequency cut signal CTRL may jump, and the potentials of the frequency cut signal CTRL connected to at least two gating circuits 20 may be different.

Specifically, the display panel may include a first display mode and a second display mode. In the first display mode, in each display frame, the potential of the frequency cut signal CTRL may be same. Accordingly, the frequency of the scanning signal OUT1 of each gating circuit 20 in the display panel may be equal to the frequency of the primary scanning signal OUT. The refresh frequency of each area in the display panel may be same, and the display panel may perform the normal display. In the second display mode, in at least one display frame, the potential of the frequency cut signal CTRL may jump. Accordingly, the potentials of the frequency cut signals CTRL connected to at least two gating circuits 20 may be different, that is, the frequency of the scanning signals of some of the gating circuits 20 in the display panel OUT1 may be equal to the frequency of the primary scanning signal OUT, and the frequency of the scanning signal OUT1 of a partial number of the gating circuit 20 may be smaller than the frequency of the primary scanning signal OUT. Therefore, the refresh frequency of some areas in the display panel may be low and the refresh frequency of some areas may be high. Accordingly, the display panel may realize different refresh frequencies in different areas; and the display panel may perform a split-screen display.

In the display panel provided by the present disclosure, switching between the first display mode and the second display mode may be achieved by adjusting the frequency cut signal CTRL, and the switching method may be relatively simple. At the same time, the refresh frequency of each region in the display panel in the second display mode may be controlled by adjusting the frequency cut signal CTRL to enrich the functions of the display panel.

Each gating circuit 20 electrically connected to the shift register 11 of each stage in the same driving circuit may be electrically connected to the same frequency cutting signal CTRL. In the second display mode, the location of the required region may be determined according to the displayed picture to determine the boundary of the region. Two rows of adjacent pixels in the display panel having different refresh frequencies may be determined first, and then according to the actual waveforms of each signal provided by the pixel circuit may be used to calculate the jumping position of the frequency cut signal CTRL, thereby controlling the refresh frequency of each area in the display panel in the second display mode through the frequency cut signal CTRL.

Figure 4:
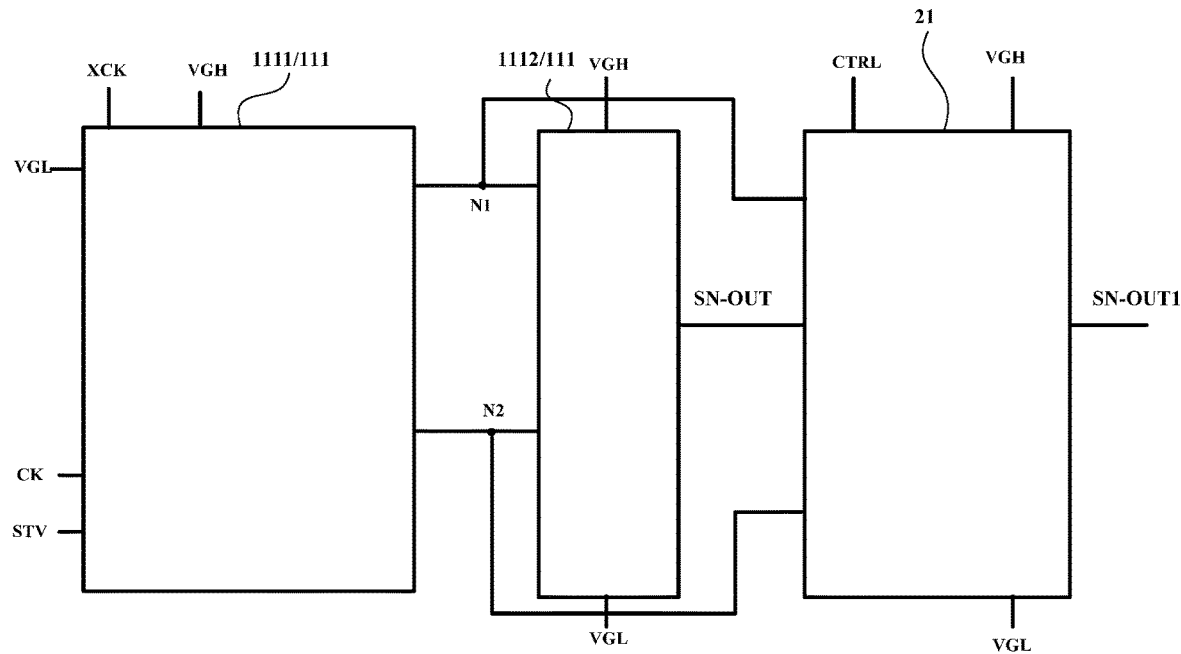
FIG. 4 illustrates an exemplary frame structure of a first shift register and a first gating circuit according to various disclosed embodiments of the present disclosure.

FIG. 4 is an exemplary schematic structural diagram of a first shift register and a first gating circuit according to various disclosed embodiments of the present disclosure. As shown in FIG. 1 and FIG. 4, in some embodiments, the driving circuit 10 may include a first driving circuit. The first driving circuit may include a plurality of first shift registers 111 connected in cascade, and the first shift registers 111 may be used to generate a first primary scanning signal SN-OUT.

The first shift register 111 may include a first control module 1111 and a first output module 1112 that are electrically connected together. The first control module 1111 may receive the input signal STV, the first voltage signal VGH and the second voltage signal VGL, and may respond to the first clock signal CK and the second clock signal XCK to control the signal of the first node N1 and the signal of the second node N2.

The first output module 1112 may receive the first voltage signal VGH and the second voltage signal VGL, and may control the first primary scanning signal SN-OUT in response to the signal of the first node N1 and the signal of the second node N2.

The gating circuit 20 may include a first gating circuit 21 corresponding to the first shift register 111. The first gating circuit 21 may be electrically connected to the corresponding first shift register 111. The first gating circuit 21 may correspond to the first shift register 111. The gating circuit 21 may be configured to generate the first scanning signal SN-OUT1.

The first gating circuit 21 may receive the first voltage signal VGH and the second voltage signal VGL, and may respond to the signal of the first node N1, the signal of the second node N2, the frequency cut signal CTRL and the first primary scanning signal SN-OUT, and may control the first scanning signal SN-OUT1.

Specifically, the driving circuit 10 may include a first driving circuit. The first driving circuit may include a plurality of first shift registers 111 in cascade, and the first shift registers 111 may be used to generate the first primary scanning signal SN-OUT. The first shift register 111 may include a first control module 1111 and a first output module 1112 that are electrically connected. Among them, the first control module 1111 may receive the input signal STV, the first voltage signal VGH and the second voltage signal VGL, and may respond to the first clock signal CK and the second clock signal XCK to control the signal of the first node N1 and the second node N2 signal. The first output module 1112 may receive the first voltage signal VGH and the second voltage signal VGL, and may control the first primary scanning signal SN-OUT in response to the signal of the first node N1 and the signal of the second node N2.

Display panels usually directly provide driving signals to the pixel circuit through the first shift register, that is, the first shift register directly provides the first primary scanning signal SN-OUT to the pixel circuit. Accordingly, the frequencies of the first primary scanning signals SN-OUT received by each area of the display panel are same, and the split-screen display (i.e., different areas of display panel display with difference frequencies) of the display panel cannot be realized.

The display panel provided by the present disclosure may also include a plurality of first gating circuits 21. The first gating circuits 21 may correspond to the first shift registers 111, and the first gating circuits 21 and their corresponding first shift registers 111 may be electrically connected. The first gating circuit 21 may receive the first voltage signal VGH and the second voltage signal VGL, and may respond to the signal of the first node N1, the signal of the second node N2, the frequency cut signal CTRL and the first primary scanning signal SN-OUT, and control the first scanning signal SN-OUT1, and the frequency of the first scanning signal SN-OUT1 may be controlled by adjusting the frequency cut signal CTRL.

In the first display mode, in each display frame, the potential of the frequency cut signal CTRL may be same, thus the frequency of the first scanning signal SN-OUT1 of each first gating circuit 21 in the display panel may be equal to the first primary scanning signal SN-OUT. Accordingly, the refresh frequency of each area in the display panel may be same, and the display panel may perform the regular display. In the second display mode, in at least one display frame, the potential of the frequency cut signal CTRL may jump such that the potentials of the frequency cut signals connected to at least two first gating circuits 21 may be different. For example, the frequencies of the first scanning signal SN-OUT1 of a partial number of first gating circuits 21 in the display panel may be equal to the frequency of the first primary scanning signal SN-OUT, and the frequencies of the first scanning signal SN-OUT1 of a partial number of the first gating circuits 21 may be smaller than the frequency of the first primary scanning signal SN-OUT such that the refresh frequency of some areas in the display panel is low and the refresh frequency of some areas is high, that is, the display panel may achieve different refresh frequencies in different areas, that is, the display panel may perform split-screen display.

In one embodiment, the first voltage signal VGH is a high-potential signal, and the second voltage signal VGL is a low-potential signal. Of course, in other embodiments of the present disclosure, the first voltage signal VGH may also be a low level signal, and the second voltage signal VGL may be a high level signal, which will not be described in detail here.

Figure 5:
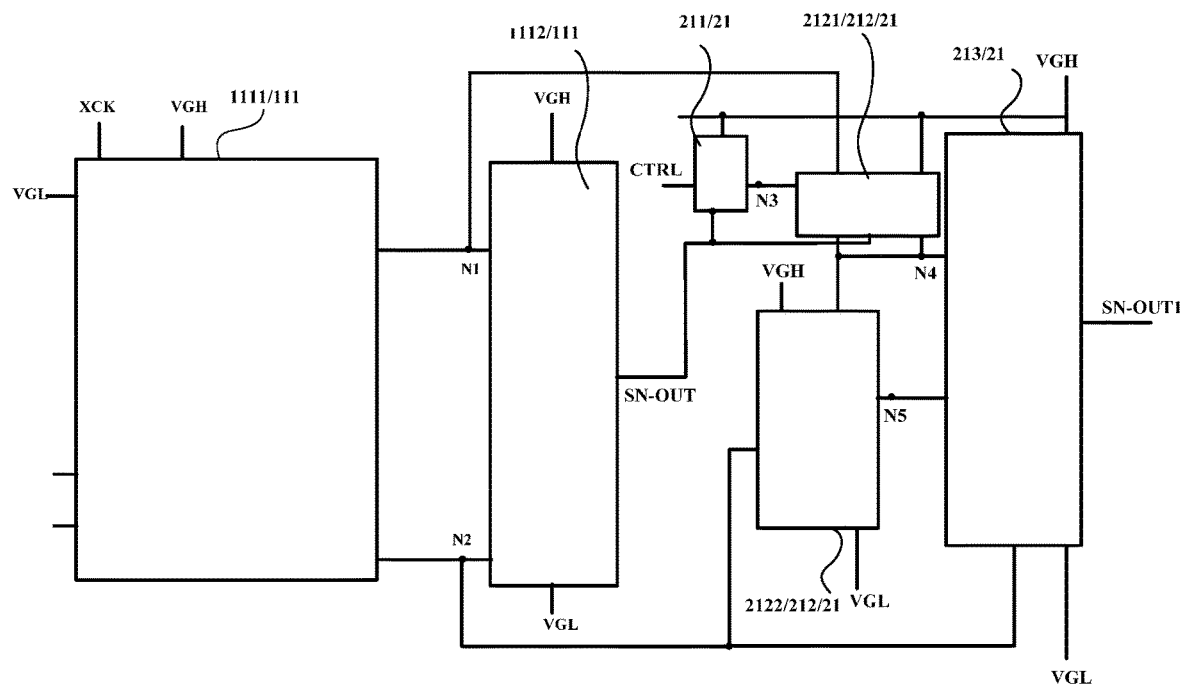
FIG. 5 illustrates another exemplary frame structure of a first shift register and a first gating circuit according to various disclosed embodiments of the present disclosure.

FIG. 5 is a schematic diagram of another exemplary frame structure of the first shift register and the first gating circuit according to various disclosed embodiments of the present disclosure. As shown in FIG. 1 and FIG. 5, in some embodiments, the first gating circuit 21 may include a second control module 211, a third control module 212 and a second output module 213.

The second control terminal 211 may receive the first voltage signal VGH, and may respond to the frequency cut signal CTRL and the first primary scanning signal SN-OUT to control the signal of the third node N3.

The third control module 212 may receive the first voltage signal VGH and the second voltage signal VGL, and may respond to the signal of the first node N1, the signal of the second node N2, the signal of the third node N3 and the first primary scanning signal SN-OUT to control the signal of the fourth node N4 and the signal of the fifth node N5.

The second output module 213 may receive the first voltage signal VGH and the second voltage signal VGL, and may control the first scan signal SN-OUT1 in response to the signal of the second node N2, the signal of the fourth node N4, and the signal of the fifth node N5.

Specifically, the first strobe circuit 21 may include a second control module 211, a third control module 212 and a second output module 213 that are electrically connected.

The second control terminal 211 may receive the first voltage signal VGH and may control the signal of the third node N3 in response to the frequency cut signal CTRL and the first primary scanning signal SN-OUT. That is, the signal of the third node N3 may be controlled by adjusting the frequency cut signal CTRL.

The third control module 212 may receive the first voltage signal VGH and the second voltage signal VGL, and may respond to the signal of the first node N1, the signal of the second node N2, the signal of the third node N3 and the first primary scanning signal SN-OUT, and may control the signal of the fourth node N4 and the signal of the fifth node N5. That is, by adjusting the signal of the third node N3, the signal of the fourth node N4 and the signal of the fifth node N5 may be adjusted.

The second output module 213 may receive the first voltage signal VGH and the second voltage signal VGL, and may control the first scan signal SN-OUT1 in response to the signal of the second node N2, the signal of the fourth node N4, and the signal of the fifth node N5. That is, the first voltage signal VGH or the second voltage signal VGL may be selected to be output under the control of the signal of the second node N2, the signal of the fourth node N4, and the signal of the fifth node N5.

That is, in the first gating circuit 21, the frequency cut signal CTRL may be adjusted to control the signal of the third node N3, and then control the signal of the fourth node N4 and the signal of the fifth node N5, and then select and output the first voltage signal VGH or the second voltage signal VGL. That is, the frequency of the first scanning signal SN-OUT1 may be controlled by adjusting the frequency cut signal CTRL.

Further, referring to FIG. 1 and FIG. 5, in some embodiments, the third control module 212 may include a first sub-module 2121 and a second sub-module 2122 that are electrically connected together. The first sub-module 2121 may receive the first voltage signal VGH and may control the signal of the fourth node N4 in response to the signal of the first node N1, the signal of the third node N3 and the first primary scanning signal. The second sub-module 2122 may receive the first voltage signal VGH and the second voltage signal VGL, and control the signal of the fifth node N5 in response to the signal of the second node N2 and the signal of the fourth node N4.

Specifically, the third control module 212 may include a first sub-module 2121 and a second sub-module 2122 that are electrically connected together. The first sub-module 2121 may receive the first voltage signal VGH and may control the signal of the fourth node N4 in response to the signal of the first node N1, the signal of the third node N3 and the first primary scanning signal. That is, the first sub-module 2121 may be configured to control the signal of the fourth node N4 such that the second output module 213 may control whether to output the first voltage signal VGH according to the signal of the fourth node N4.

The second sub-module 2122 may receive the first voltage signal VGH and the second voltage signal VGL, and may control the signal of the fifth node N5 in response to the signal of the second node N2 and the signal of the fourth node N4. That is, the second sub-module 2122 may be configured to control the signal of the fifth node N5 such that the second output module 213 may control whether to output the second voltage signal VGL according to the signal of the fifth node N5.

Figure 6:
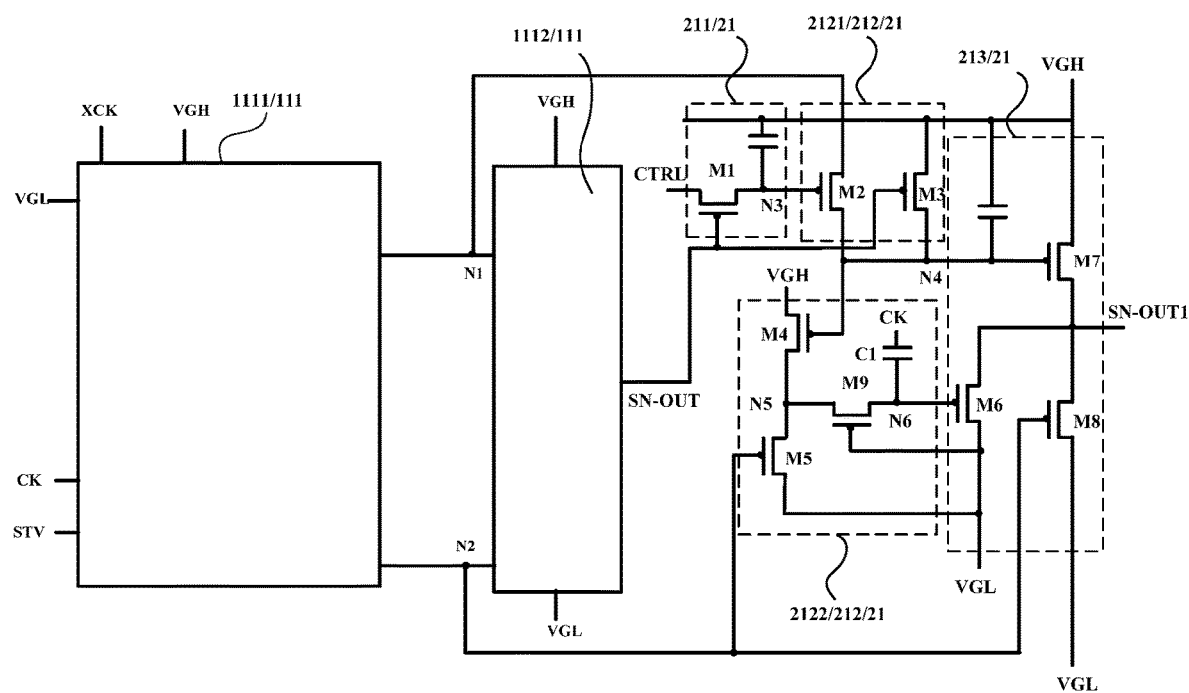
FIG. 6 illustrates an exemplary circuit of a first shift register and a first gating circuit according to various disclosed embodiments of the present disclosure.

FIG. 6 is an exemplary schematic circuit diagram of the first shift register and the first gating circuit according to various disclosed embodiments of the present disclosure. As shown FIG. 1 and FIG. 6, in some embodiments, the second control module 211 may include a first transistor M1. The gate of the first transistor M1 may be connected to the first primary scanning signal SN-OUT, the source of the first transistor M1 may be connected to the frequency cut signal CTRL, and the drain of the first transistor M1 may be electrically connected to the third node N3.

The first sub-module 2121 may include a second transistor M2 and a third transistor M3. The gate of the second transistor M2 may be electrically connected to the third node N3. The source of the second transistor M2 may be electrically connected to the first node N1. The drain of the second transistor M2 may be electrically connected to the fourth node N4. The gate of the third transistor M3 may be electrically connected to the first primary scanning signal SN-OUT, the source of the third transistor M3 may be connected to the first voltage signal VGH, and the drain of the third transistor M3 may be electrically connected to the fourth node N4.

The second sub-module 2122 may include a fourth transistor M4 and a fifth transistor M5. The gate of the fourth transistor M4 may be electrically connected to the fourth node N4. The source of the fourth transistor M4 may be connected to the first voltage signal VGH. The gate of the fourth transistor M4 may be electrically connected to the fourth node N4. The drain of the fifth transistor M4 may be electrically connected to the fifth node N5. The gate of the fifth transistor M5 may be electrically connected to the second node N2, the source of the fifth transistor M5 may be connected to the second voltage signal VGL, and the drain of the fifth transistor M5 may be electrically connected to the fifth node N5.

The second output module 213 may include a sixth transistor M6, a seventh transistor M7, and an eighth transistor M8. The gate of the sixth transistor M6 may be electrically connected to the fourth node N4, and the source of the sixth transistor M6 may be connected to the first voltage signal VGH. The drain of the sixth transistor M6 may be connected to the first scanning signal SN-OUT1. The gate of the seventh transistor M7 may be electrically connected to the second node N2, the source of the seventh transistor M7 may be connected to the second voltage signal VGL, and the gate of the seventh transistor M7 may be electrically connected to the second node N2. The drain of the eighth transistor M8 may be connected to the first scanning signal SN-OUT1, the gate of the eighth transistor M8 may be electrically connected to the fifth node N5, the source of the eighth transistor M8 may be connected to the second voltage signal VGL, and the drain of the eighth transistor M8 may be connected to the first scanning signal SN-OUT1.

Specifically, the signal of the first node N1 in the first shift register 111 may control whether the first primary scanning signal SN-OUT output by the first output module 1112 is the first voltage signal VGH. Whether the signal of the first node N1 may be written to the first gating circuit 21 may be controlled by the frequency cut signal CTRL. When the frequency cut signal CTRL is at a low level, the signal of the fourth node N4 may remain consistent with the signal of the first node N1 such that the first scanning signal SN-OUT1 may remain consistent with the first primary scanning signal SN-OUT. When the frequency cut signal CTRL is at a high level, the signal of the first node N1 may not be written to the fourth node N4, and the signal of the fourth node N4 may maintain the original signal. The first primary scanning signal SN-OUT may control the third transistor M3 to periodically write a high level signal to the fourth node N4 such that the fourth node N4 may maintain a high level. Accordingly, the seventh transistor M7 may be turned off and the first voltage signal VGH may not be transmitted to the drain of the seventh transistor M7. When the signal of the second node N2 controls the first primary scan signal SN-OUT to be the second voltage signal VGL, the signal of the second node N2 may control the eighth transistor M8 to be turned on such that the first scan signal SN-OUT1 may be the second voltage signal VGL. Through the settings of the fourth transistor M4, the fifth transistor M5 and the sixth transistor M6, when the frequency cutting signal CTRL is at a high level and the first primary scanning signal SN-OUT is the first voltage signal VGH, the sixth transistor M6 and the seventh transistors M7 may all be turned off, and the first scanning signal SN-OUT1 may be the second voltage signal VGL.

Figure 7:
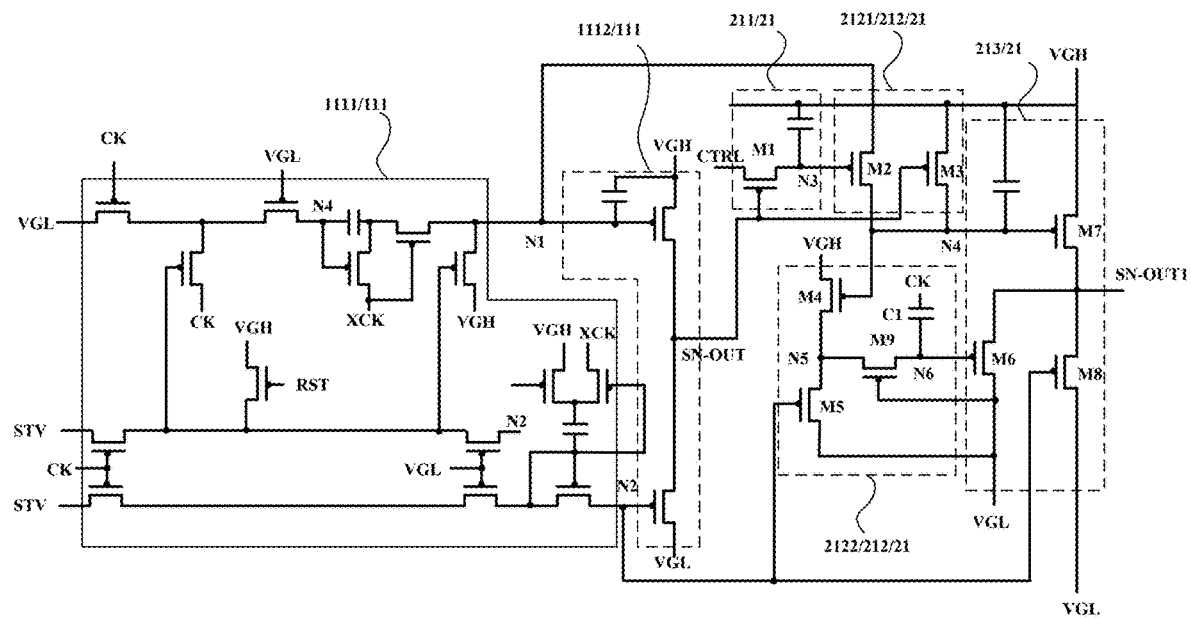
FIG. 7 illustrates another exemplary circuit of a first shift register and a first gating circuit according to various disclosed embodiments of the present disclosure.
Figure 8:
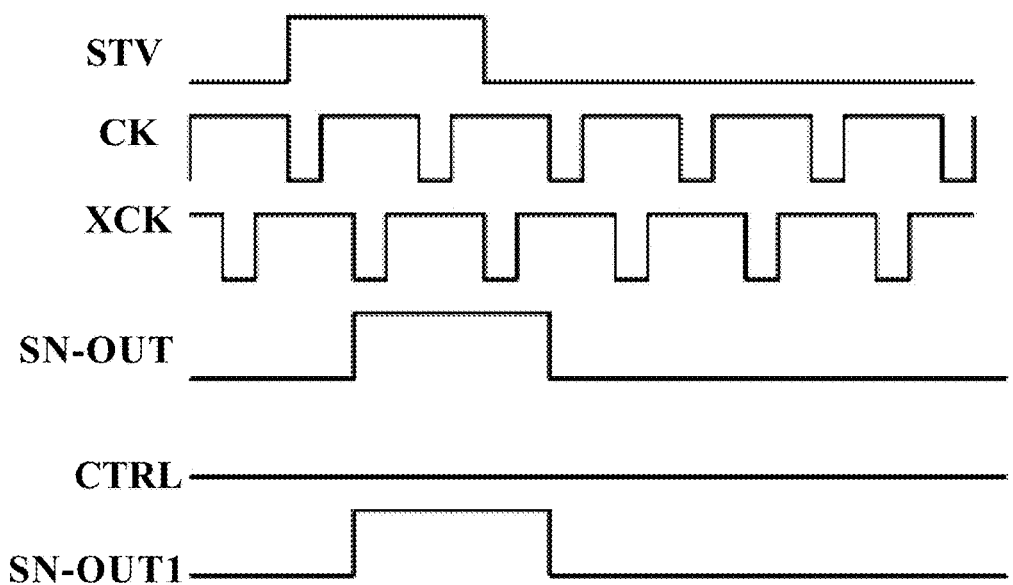
FIG. 8 illustrates an exemplary driving time sequence according to various disclosed embodiments of the present disclosure.

FIG. 7 is another exemplary schematic circuit diagram of the first shift register and the first gating circuit according to various disclosed embodiments of the present disclosure. FIG. 8 is an exemplary driving sequence diagram according to various disclosed embodiments of the present disclosure. As shown in FIGS. 7-8, when the signal at the first node N1 is at a high level and the signal at the second node N2 is at a low potential, the first primary scanning signal SN-OUT may be the second voltage signal VGL. At this time, the first transistor M1 may be turned on. When the frequency cutting signal CTRL is at a low level, the signal of the third node N3 may be at a low level, and the second transistor M2 may be turned on. At this time, the signal of the fourth node N4 may remain consistent with the signal of the first node N1 such that the seventh transistor M7 may be turned off and the eighth transistor M8 may be turned on, and the first scanning signal SN-OUT1 may be the second voltage signal VGL.

When the signal at the first node N1 is at a low level and the signal at the second node N2 is at a high level, the first primary scanning signal SN-OUT may be the first voltage signal VGH. At this time, the first transistor M1 and the third transistor M3 may be turned off. When the signal of the third node N3 remains low, the second transistor M2 may be turned on, the signal of the fourth node N4 may remain consistent with the signal of the first node N1, and the signal of the fourth node N4 may be a low level. Accordingly, the seventh transistor M7 may be turned on; and the first scanning signal SN-OUT1 may be the first voltage signal VGH. That is, when the frequency cut signal CTRL is at a low level, the first scanning signal SN-OUT1 may remain consistent with the first primary scanning signal SN-OUT.

Figure 9:
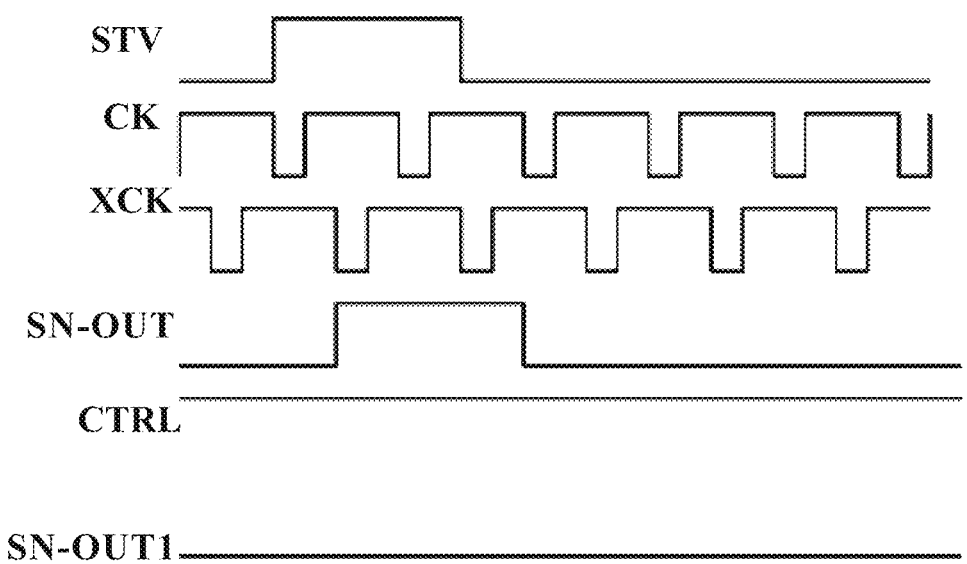
FIG. 9 illustrates another exemplary driving time sequence according to various disclosed embodiments of the present disclosure.

FIG. 9 is another exemplary driving time sequence according to various disclosed embodiments of the present disclosure. As shown in FIG. 7 and FIG. 9, when the signal of the first node N1 is at a high potential and the signal at the second node N2 is at a low potential, the first primary scanning signal SN-OUT may be the second voltage signal VGL. At this time, the first transistor M1 may be turned on. When the frequency cutting signal CTRL is at a high level, and the signal at the third node N3 is at a high level, the second transistor M2 may be turned off. At this time, the signal of the first node N1 cannot be written to the fourth node N4. At this time, the third transistor M3 may be turned on, the signal of the fourth node N4 may be at a high level, the seventh transistor M7 may be turned off, the eighth transistor M8 may be turned on, and the first scanning signal SN-OUT1 may be the second voltage signal VGL.

When the signal at the first node N1 is at a low level and the signal at the second node N2 is at a high level, the first primary scanning signal SN-OUT may be the first voltage signal VGH. At this time, the first transistor M1 and the third transistor M3 may be turned off, the signal of the third node N3 may remain at a high potential, the second transistor M2 may be turned off, and the signal of the fourth node N4 may remain at a high level. Accordingly, the seventh transistor M7 may be turned off, the fifth transistor M5 and the eighth transistor M8 may be turned off, and the fifth node N5 may remain at a low level and the sixth transistor M6 may be at a low level. Accordingly, the sixth transistor M6 may be turned on, and the first scanning signal SN-OUT1 may be the second voltage signal VGL. That is, when the frequency cut signal CTRL is at a high level, the first scanning signal SN-OUT1 may be the second voltage signal VGL.

Therefore, in the first display mode, in each display frame, the potential of the frequency cut signal CTRL may be the same, when the frequency of the first scanning signal SN-OUT1 of each first gating circuit 21 in the display panel is equal to the first primary scanning signal SN-OUT, the refresh frequency of each area in the display panel may be the same, and the display panel may perform the regular display. In the second display mode, in at least one display frame, the potential of the frequency cut signal CTRL may jump, thus the potential of the frequency cut signal CTRL connected to at least two first gating circuits 21 may be different, that is, the frequency of the first scanning signal SN-OUT1 of a portion of the first gating circuits 21 in the display panel may be equal to the frequency of the first primary scanning signal SN-OUT, and the frequency of the first scanning signal SN-OUT1 of a portion of the first gating circuits 21 may be smaller than the first primary scanning signal SN-OUT. Thus, the refresh frequency of some areas in the display panel may be low and the refresh frequency of some areas may be high. That is, the display panel may achieve different refresh frequencies in different areas. Accordingly, the display panel may perform the split-screen display.

It should be noted that FIG. 7 exemplarily shows that the first shift register 111 is a 16T3C circuit. In other embodiments of the present disclosure, the first shift register 111 may also adopt circuits with other structures.

Figure 10:
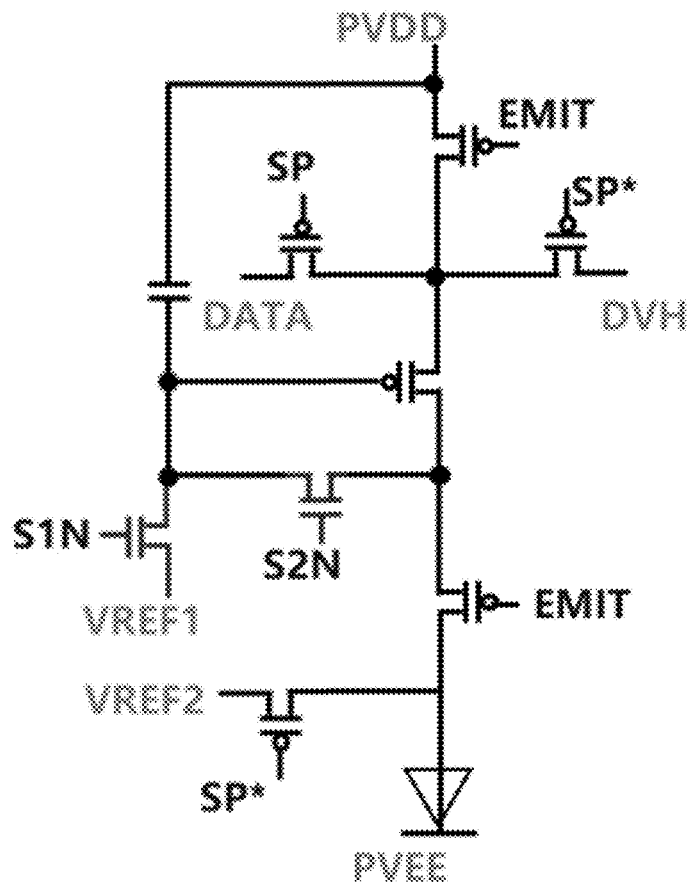
FIG. 10 illustrates an exemplary circuit diagram of a pixel circuit according to various disclosed embodiments of the present disclosure.
Figure 11:
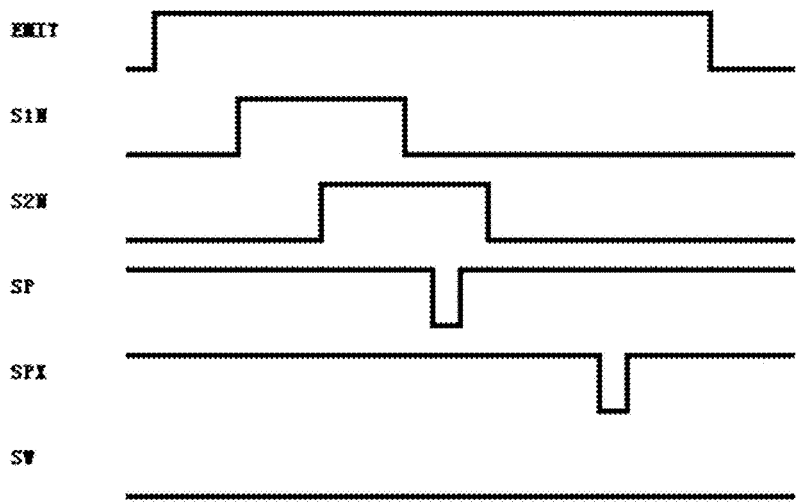
FIG. 11 illustrates an exemplary driving time sequence of a pixel circuit according to various disclosed embodiments of the present disclosure.

FIG. 10 is an exemplary circuit diagram of a pixel circuit according to various disclosed embodiments of the present disclosure. FIG. 11 is an exemplary driving time sequence of the pixel circuit according to various disclosed embodiments of the present disclosure. As shown in FIGS. 10-11, the pixel circuit may include a first reset module and a threshold compensation module. The control terminal of the first reset module may be electrically connected to the signal terminal S1N, the first terminal of the first reset module may be electrically connected to the reference voltage signal, and the second terminal of the first reset module may be electrically connected to the gate of the driving transistor. In the first reset stage, the signal at the signal terminal S1N may control the first reset module to be turned on, and the reference voltage signal may be written into the gate of the driving transistor to realize the reset of the driving transistor. The control terminal of the threshold compensation module may be electrically connected to the signal terminal S2N, the first terminal of the threshold compensation module may be electrically connected to the drain of the driving transistor, and the second terminal of the threshold compensation module may be electrically connected to the gate of the driving transistor. In the threshold compensation stage, the signal at the signal terminal S2N may control the threshold compensation module to be turned on, which may be used to connect the drain of the driving transistor with the gate of the driving transistor to realize compensation of the threshold voltage of the driving transistor. The first scanning signal SN-OUT1 may be used to provide a signal to the signal terminal S1N and/or the signal terminal S2N in the pixel circuit.

It should be noted that this embodiment exemplarily shows a pixel circuit. In other embodiments of the present disclosure, the pixel circuit may also adopt circuits with other structures.

Further, referring to FIG. 1 and FIG. 7, in some embodiments, the second sub-module 2122 may also include a ninth transistor M9 and a first capacitor C1. The gate of the ninth transistor M9 may be connected to the second voltage signal VGL. The source of the ninth transistor M9 may be electrically connected to the fifth node N5, and the drain of the ninth transistor M9 may be electrically connected to the sixth node N6. The first electrode of the first capacitor C1 may be electrically connected to the sixth node N6, and the second electrode of the first capacitor C1 may be electrically connected to the first clock signal CK. The gate of the eighth transistor M8 may be electrically connected to the sixth node N6.

Specifically, when the input signal STV is a low level, although the signal of the fifth node N5 is a low level, the voltage of the signal of the fifth node N5 may not be low enough due to the influence of the threshold voltage of the transistor. Through the settings of the ninth transistor M9 and the first capacitor C1, when the first scan signal SN-OUT1 jumps from a high level to a low level, the potential of the sixth node N6 may be pulled down through the coupling of the first capacitor C1 such that the potential of the sixth node N6 may be lowered. The drain of the eighth transistor M8 may output the second voltage signal VGL. At the same time, since the signal of the sixth node N6 may be at a very low level and the second node N2 may be at a high level, the VGS of the fifth transistor M5 may be too large, which may easily cause the failure of the fifth transistor M5 after long-term operation. By setting the ninth transistor M9, when the signal of the sixth node N6 is at a very low level, the signal of the fifth node N5 may be at a regular low level, thereby reducing the voltage difference of the fifth transistor M5.

Referring to FIG. 1 and FIG. 7, in some embodiments, the first M1 to the eighth transistors M8 may all be P-type transistors.

Specifically, in the first gating circuit 21 provided by the present disclosure, the first transistor M1 to the eighth transistor M8 may be all P-type transistors. Accordingly, using N-type transistors to set up the first gating circuit 21 may be avoided. To reduce the leakage current, N-type transistors may usually use IGZO N-type transistors. IGZO N-type transistors usually have the problem of low mobility. Therefore, the IGZO N-type transistors may need to be very large, which may not be conducive to achieving a narrow frame. At the same time, IGZO N-type transistors may also have the problem of poor stability after long-term operation, which may cause the output capability of the transistor to weaken and even cause circuit failure. In the first gating circuit 21 provided by the embodiment of the present disclosure, the first transistor M1 to the eighth transistor M8 may be all P-type transistors, which may effectively improve the stability of the circuit while realizing the split-screen display.

Figure 12:
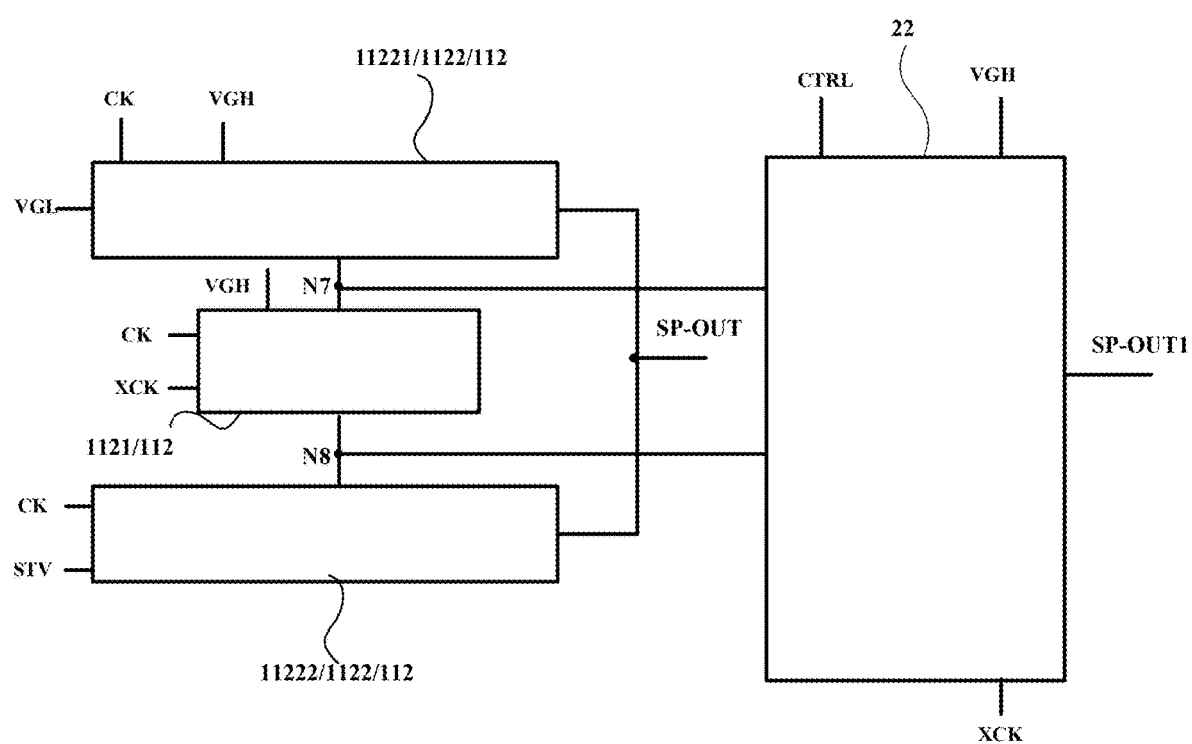
FIG. 12 illustrates an exemplary frame structure of a second shift register and a second gating circuit according to various disclosed embodiments of the present disclosure.
Figure 13A:
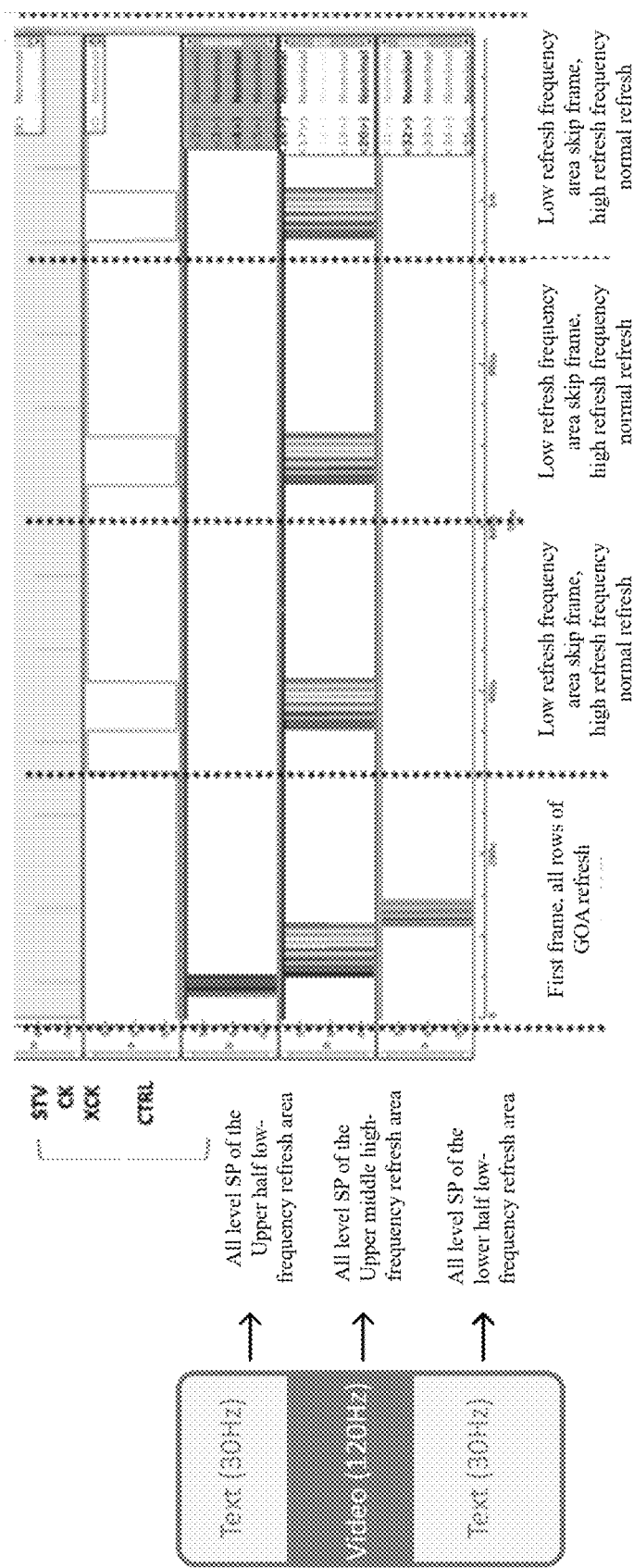
FIG. 13A illustrates an exemplary time sequence when a display panel works under a second display mode according to various disclosed embodiments.
Figure 13B:
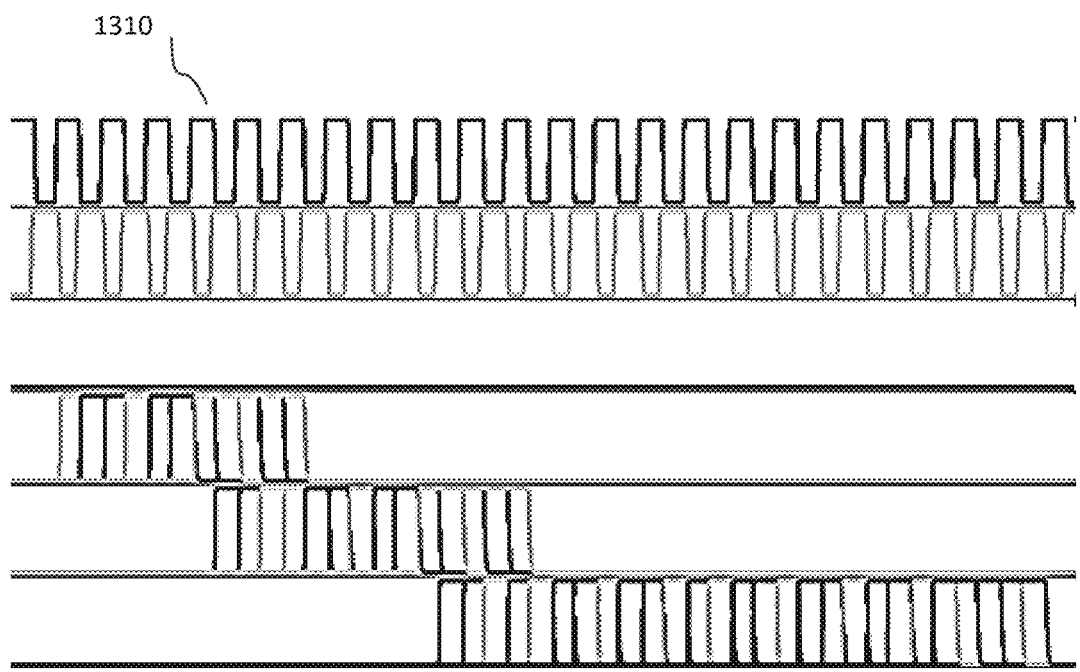
FIG. 13B illustrates an exemplary time sequence of an enlarged refresh frame of FIG. 13A when the display panel works under the second display mode according to various disclosed embodiments.
Figure 13C:
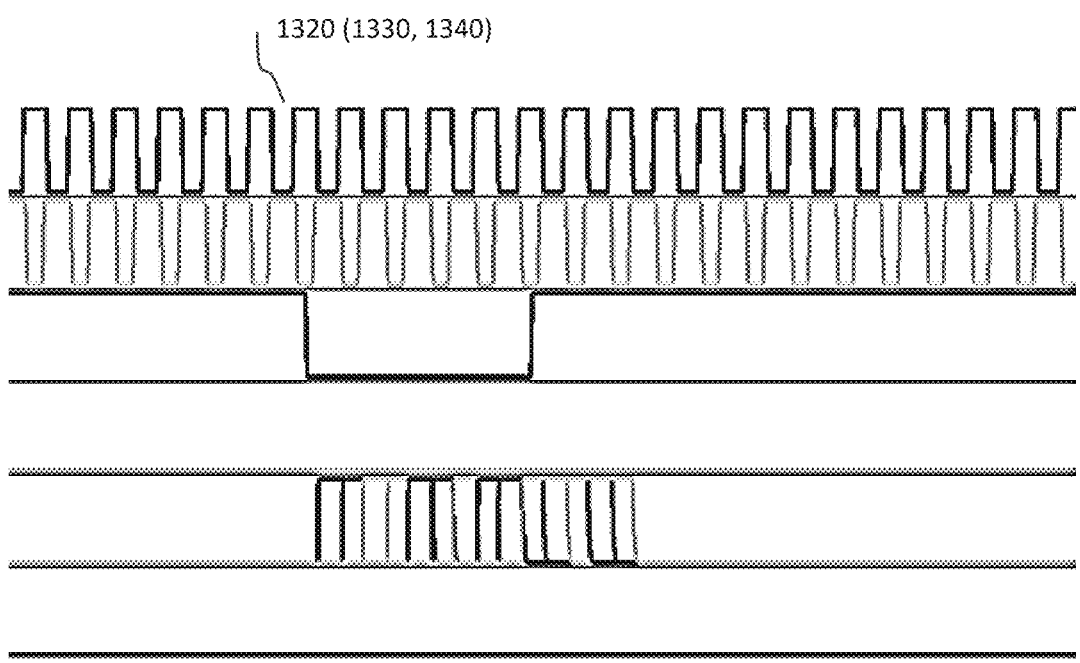
FIG. 13C illustrates an exemplary time sequence of an enlarged non-refresh frame of FIG. 13A when the display panel works under the second display mode according to various disclosed embodiments.

FIG. 12 is a schematic diagram of an exemplary frame structure of a second shift register and a second gating circuit according to various embodiments of the present disclosure. FIG. 13A is another exemplary time sequence of the display panel under a second display mode according to various disclosed embodiments of the present disclosure. As shown in FIG. 13A, the exemplary time sequence of the display panel includes a refresh frame 1310 (first frame, all rows of GOA refresh), and three non-refresh frames 320, 330, 340 (low refresh frequency area skip frame, high refresh frequency normal refresh). FIG. 13B illustrates an exemplary time sequence of an enlarged refresh frame 1310 of the display panel of FIG. 13A provided by the present disclosure in the second display mode. FIG. 13C illustrates an exemplary time sequence of an enlarged non-refresh frame 1320 (1330, 1340) of the display panel of FIG. 13A provided by the present disclosure in the second display mode. Referring to FIG. 1, and as shown in FIG. 12 and FIGS. 13A, 13B and 13C in some embodiments, the driving circuit 10 may include a second driving circuit. The second driving circuit may include a plurality of second shift registers 112 in cascade. The second shift registers 112 may be configured to generate the second primary scanning signal SP-OUT.

The second shift register 112 may include a fourth control module 1121 and a third output module 1122 electrically connected together. The fourth control module 1121 may receive the first voltage signal VGH, and may respond to the first clock signal CK and the second clock signal XCK to control the signal of the seventh node N7 and the signal of the eighth node N8. The third output module 1122 may receive the input signal STV, the first voltage signal VGH and the second voltage signal VGL, and may respond to the signal of the seventh node N7, the signal of the eighth node N8, the first clock signal CK and the second clock signal XCK to control the second primary scanning signal SP-OUT.

The gating circuit 20 may include a second gating circuit 22 corresponding to the second shift register 112. The second gating circuit 22 may be electrically connected to the corresponding second shift register 112. The second gating circuit 22 may correspond to the second shift register 112. The second gating circuit 22 may be configured to generate the second scanning signal SP-OUT1. The second gating circuit 22 may receive the first voltage signal VGH and control the second scanning signal SP-OUT1 in response to the signal of the seventh node N7, the signal of the eighth node N8, the second clock signal XCK and the frequency cut signal CTRL.

Specifically, the driving circuit 10 may include a second driving circuit. The second driving circuit may include a plurality of second shift registers 112 connected in cascade. The second shift registers 112 may be configured to generate the second primary scanning signal SP-OUT. The second shift register 112 may include a fourth control module 1121 and a third output module 1122 electrically connected together. The fourth control module 1121 may receive the first voltage signal VGH, and may respond to the first clock signal CK and the second clock signal XCK to control the signal of the seventh node N7 and the signal of the eighth node N8. The third output module 1122 may receive the input signal STV, the first voltage signal VGH and the second voltage signal VGL, and may respond to the signal of the seventh node N7, the signal of the eighth node N8, the first clock signal CK and the second clock signal XCK, and may control the second primary scanning signal SP-OUT.

Display panels usually directly provide driving signals to the pixel circuit through the second shift register, that is, the second shift register directly provides the second scanning signal SP-OUT1 to the pixel circuit. Accordingly, the frequency of the second scanning signal SP-OUT1 received by each area in the display panel is same, and the split-screen display of the display panel cannot be realized.

The display panel provided by the present disclosure may also include a plurality of second gating circuits 22. The second gating circuits 22 may correspond to the second shift registers 112, and the second gating circuits 22 and their corresponding second shift registers 112 may be electrically connected. The second gating circuits 22 may be used to generate the second scanning signal SP-OUT1. The second gating circuit 22 may receive the first voltage signal VGH and may control the second scan signal SP-OUT1 in response to the signal of the seventh node N7, the signal of the eighth node N8, the second clock signal XCK and the frequency cut signal CTRL.

In the first display mode, in each display frame, the potential of the frequency cut signal CTRL may be same, thus the frequency of the second scanning signal SP-OUT1 of each second gating circuit 22 in the display panel may be equal to the second primary scanning signal SP-OUT. When the refresh frequency of each area in the display panel is same, the display panel may perform a regular display. In the second display mode, in at least one display frame, the potential of the frequency cut signal CTRL may jump such that the potential of the frequency cut signal CTRL connected to the at least two second gating circuits 22 may be different, that is, the frequency of the second scanning signal SP-OUT1 of a partial number of the second gating circuits 22 in the display panel may be equal to the frequency of the second primary scanning signal SP-OUT, and the frequency of the second scanning signal SP-OUT1 of a partial number of the second gating circuit 22 may be smaller than the frequency of the second primary scanning signal SP-OUT. Accordingly, the refresh frequency of some areas in the display panel may be low and the refresh frequency of some areas may be high. Thus, the display panel may achieve different refresh frequencies in different areas; and the display panel may perform split-screen display.

Figure 14:
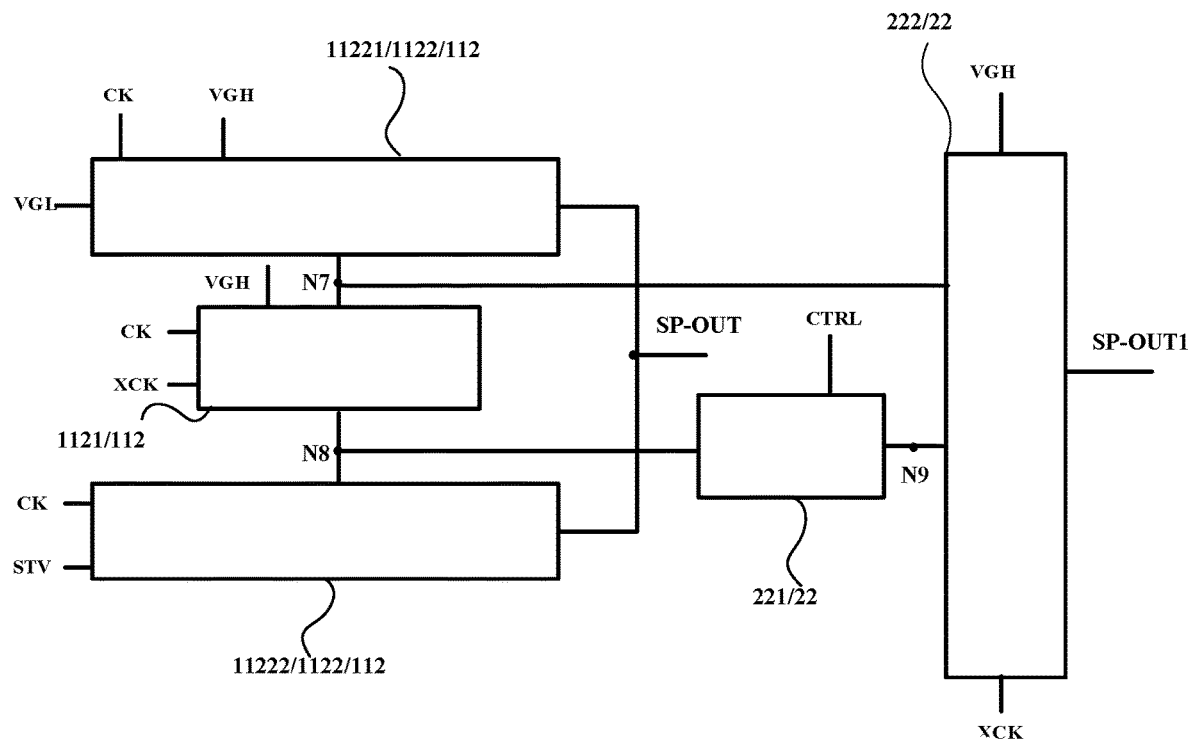
FIG. 14 illustrates another exemplary frame structure of a second shift register and a second gating circuit according to various disclosed embodiments of the present disclosure.

FIG. 14 is a schematic diagram of another exemplary frame structure of the second shift register and the second gating circuit according to various disclosed embodiments of the present disclosure. As shown in FIG. 1 and FIG. 14, in some embodiments, the second gating circuit 22 may include a fifth control module 221 and a fourth output module 222 that are electrically connected together.

The fifth control module 221 may respond to the frequency cut signal CTRL and the signal of the eighth node N8, and may control the signal of the ninth node N9. The fourth output module 222 may receive the first voltage signal VGH and may control the second scanning signal SP-OUT1 in response to the signal of the seventh node N7, the signal of the ninth node N9 and the second clock signal XCK.

Specifically, the second gating circuit 22 may include a fifth control module 221 and a fourth output module 222 that are electrically connected together. The fifth control module 221 may respond to the frequency cut signal CTRL and the signal of the eighth node N8 to control the signal of the ninth node N9. The signal of the ninth node N9 may be controlled by adjusting the frequency cut signal CTRL.

The fourth output module 222 may receive the first voltage signal VGH and may control the second scan signal SP-OUT1 in response to the signal of the seventh node N7, the signal of the ninth node N9 and the second clock signal XCK. That is, the first voltage signal VGH or the second voltage signal VGL may be selected to be output under the control of the signal of the seventh node N7 and the signal of the ninth node N9.

In the second gating circuit 22, the signal of the ninth node N9 may be controlled by adjusting the frequency cut signal CTRL, and then the first voltage signal VGH or the second clock signal XCK may be selectively output. That is, the frequency of the second scanning signal SP-OUT1 may be controlled by adjusting the frequency cut signal CTRL.

Further, referring to FIG. 1 and FIG. 14, in some embodiments, the third output module 1122 may include a third sub-module 11221 and a fourth sub-module 11222. The third sub-module 11221 may receive the first voltage signal VGH and the second voltage signal VGL, and may respond to the first clock signal CK and the signal of the seventh node N7 to control the second primary scanning signal SP-OUT. The fourth sub-module 11222 may receive the input signal STV and the second voltage signal VGL, and may control the second primary scanning signal SP-OUT in response to the first clock signal CK, the second clock signal XCK and the signal of the eighth node N8.

Specifically, the third output module 1122 may include a third sub-module 11221 and a fourth sub-module 11222 that electrically connected together. Among them, the third sub-module 11221 may receive the first voltage signal VGH and the second voltage signal VGL, and may respond to the first clock signal CK and the signal of the seventh node N7 to control the second primary scanning signal SP-OUT. That is, the third sub-module 11221 may be controlled according to the signal of the seventh node N7 whether to make the second primary scanning signal SP-OUT become the first voltage signal VGH.

The fourth sub-module 11222 may receive the input signal STV and the second voltage signal VGL, and may control the second primary scanning signal SP-OUT in response to the first clock signal CK, the second clock signal XCK and the signal of the eighth node N8. That is, the fourth sub-module 11222 may be controlled according to the signal of the seventh node N7 whether to make the second primary scanning signal SP-OUT be the second clock signal XCK.

Figure 15:
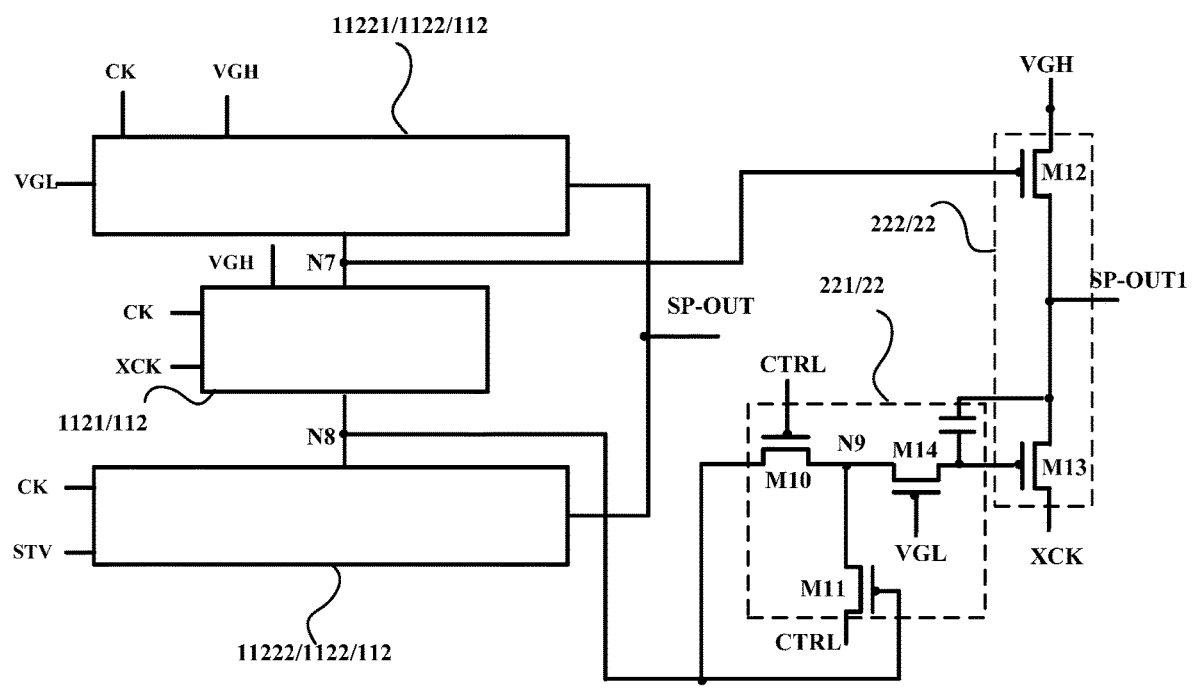
FIG. 15 illustrates another exemplary frame structure of a second shift register and a second gating circuit according to various disclosed embodiments of the present disclosure.

FIG. 15 is an exemplary schematic circuit diagram of the second shift register and the second strobe circuit according to various disclosed embodiments of the present disclosure. As shown in FIG. 1 and FIG. 15, in some embodiments, the fifth control module 221 may include a tenth transistor M10 and an eleventh transistor M11. The gate of the tenth transistor M10 may be connected to the frequency cutting signal CTRL, the source of the tenth transistor M10 may be electrically connected to the eighth node N8, and the drain of the tenth transistor M10 may be electrically connected to the ninth node N9. The gate of the eleventh transistor M11 may be electrically connected to the eighth node N8, the source of the eleventh transistor M11 may be connected to the frequency cut signal CTRL, and the drain of the eleventh transistor M11 may be electrically connected to the ninth node N9.

The fourth output module 222 may include a twelfth transistor M12 and a thirteenth transistor M13. The gate of the twelfth transistor M12 may be electrically connected to the seventh node N7. The source of the twelfth transistor M12 may be connected to the first voltage signal VGH. The drain of the twelfth transistors M12 may be connected to the second scan signal SP-OUT1. The gate of the thirteenth transistor M13 may be electrically connected to the ninth node N9. The source of the thirteenth transistor M13 may be connected to the second clock signal XCK. The drain of the thirteenth transistor M13 may be connected to the second scan signal SP-OUT1.

Specifically, when the frequency cut signal CTRL is at a low level, the signal of the eighth node N8 may be written to the ninth node N9. Accordingly, the second scanning signal SP-OUT1 may remain consistent with the second primary scanning signal SP-OUT. When the frequency cut signal CTRL is at a high level, the ninth node N9 may be written through the eleventh transistor M11. Accordingly, the thirteenth transistor M13 may be turned off such that the second clock signal XCK may not be transmitted to the drain of the thirteenth transistor M13, and the second scan signal SP-OUT1 may maintain a high potential.

Figure 16:
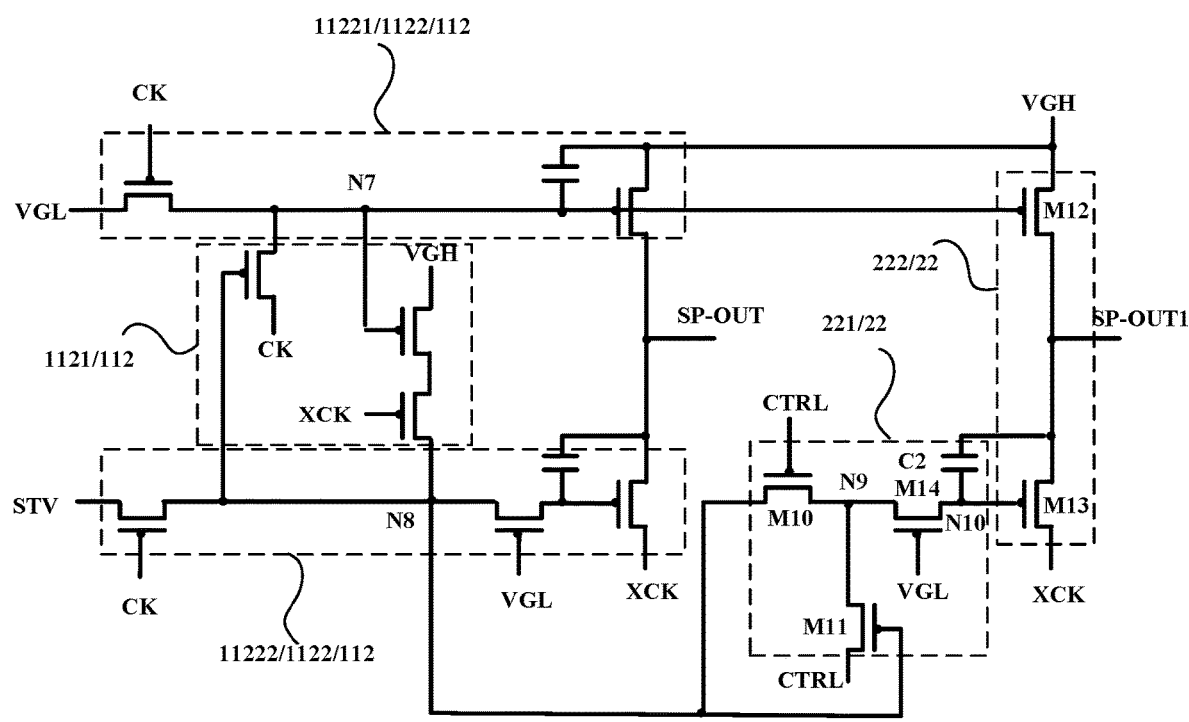
FIG. 16 illustrates another exemplary circuit of a second shift register and a second gating circuit according to various disclosed embodiments of the present disclosure.
Figure 17:
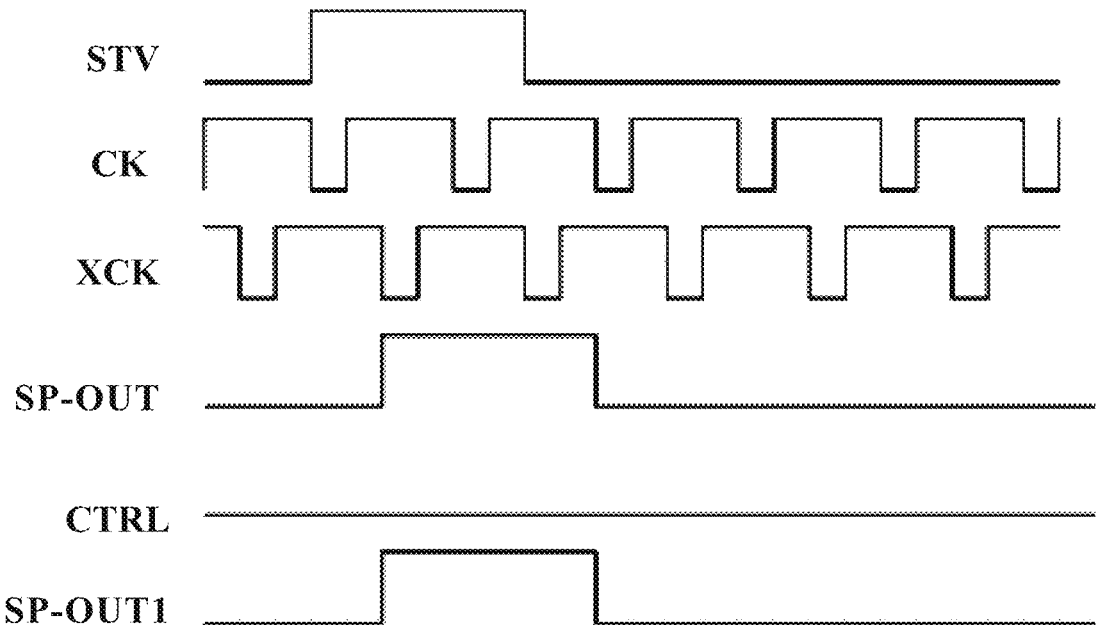
FIG. 17 illustrates another exemplary driving time sequence according to various disclosed embodiments of the present disclosure.

FIG. 16 is another exemplary schematic circuit diagram of the second shift register and the second strobe circuit according to various disclosed embodiments of the present disclosure. FIG. 17 is another exemplary driving time sequence according to various disclosed embodiments of the present disclosure. As shown in FIGS. 16-17, when the frequency cut signal CTRL is at a low level, the tenth transistor M10 may be turned on, and the signal of the eighth node N8 may be written to the ninth node N9, that is, the signal of the ninth node N9 may be same as the signal of the eighth node N8. Accordingly, the second scan signal SP-OUT1 may be controlled through the signal of the seventh node N7 and the signal of the eighth node N8. Because the signal of the seventh node N7 and the signal of the eighth node N8 may control the second primary scan signal SP-OUT, the second scan signal SP-OUT1 may be consistent with the second primary scan signal SP-OUT1. That is, when the frequency cut signal CTRL is at a low level, the second scanning signal SP-OUT1 may remain consistent with the second primary scanning signal SP-OUT.

Figure 18:
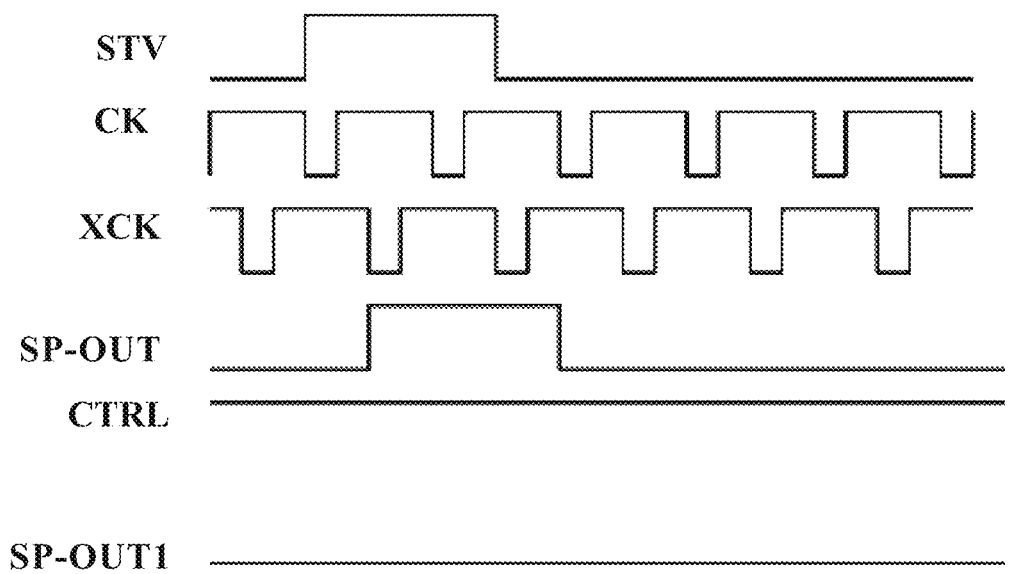
FIG. 18 illustrates another exemplary driving time sequence according to various disclosed embodiments of the present disclosure.

FIG. 18 is another exemplary driving time sequence according to various disclosed embodiments of the present disclosure. As shown in FIG. 16 and FIG. 18, when the frequency cut signal CTRL is at a high level, the signal at the seventh node N7 is at a low level, and the signal at the eighth node N8 is at a high level, the twelfth transistor M12 may be turned on, and the second scanning signal SP-OUT1 may be the first voltage signal VGH. When the signal at the seventh node N7 is at a high level and the signal at the eighth node N8 is at a low level, the eleventh transistor M11 may be turned on, and the frequency cutting signal CTRL may be written into the ninth node N9 through the eleventh transistor M11, that is, the signal of the ninth node N9 is at a high level. Accordingly, the signal of the tenth node N10 may be at a high level, and the thirteenth transistor M13 may be turned off, so the second clock signal XCK may not be transmitted to the drain of the thirteenth transistor M13, and the second scanning signal SP-OUT1 may remain high. That is, when the frequency cut signal CTRL is at a high level, the second scanning signal SP-OUT1 may be the first voltage signal VGH.

Therefore, in the first display mode, in each display frame, the potential of the frequency cut signal CTRL may be same, when the frequency of the second scanning signal SP-OUT1 of each second gating circuit 22 in the display panel may be equal to the frequency of the second primary scanning signal SP-OUT, the refresh frequency of each area in the display panel may be same, and the display panel may perform a regular display. In the second display mode, in at least one display frame, the potential of the frequency cut signal CTRL may jump such that the potentials of the frequency cut signal CTRL connected to at least two second gating circuits 22 may be different, that is, the frequency of the second scanning signal SP-OUT1 of a partial number of the second gating circuits 22 in the display panel may be equal to the frequency of the second primary scanning signal SP-OUT, and the frequency of the second scanning signal SP-OUT1 of a partial number of the second gating circuits 22 may be smaller than the frequency the second primary scanning signal SP-OUT. Accordingly, the refresh frequency of some areas in the display panel may be low and the refresh frequency of some areas may be high, that is, the display panel may achieve different refresh frequencies in different areas, that is, the display panel may perform a split-screen display.

It should be noted that FIG. 16 exemplarily shows that the second shift register 112 is an 8T2C circuit. In other embodiments of the present disclosure, the second shift register 112 may also adopt circuits with other structures.

In some embodiments, referring to FIGS. 10 and 11, the pixel circuit may also include a data writing module. The control terminal of the data writing module may be electrically connected to the signal terminal SP. The first terminal of the data writing module may be electrically connected to the data voltage signal. The second terminal of the data writing module may be electrically connected to the source of the driving transistor. In the data writing stage, the signal at the signal terminal SP may control the data writing module to be turned on such that the data voltage signal may be written into the source of the driving transistor. The second scanning signal SP-OUT1 may be configured to provide a signal to the signal terminal SP in the pixel circuit.

Further, referring to FIG. 1 and FIG. 16, in some embodiments, the fifth control module 221 may also include a fourteenth transistor M14 and a second capacitor C2. The gate of the fourteenth transistor M14 may be connected to the second voltage signal VGL. The source of the fourteenth transistor M14 may be electrically connected to the ninth node N9, and the drain of the fourteenth transistor M14 may be electrically connected to the tenth node N10. The first electrode of the second capacitor C2 may be electrically connected to the tenth node N10, and the second electrode of the second capacitor C2 may be electrically connected to the second scanning signal SP-OUT. The gate of the thirteenth transistor M13 may be electrically connected to the tenth node N10.

Specifically, when the input signal STV is at a low level, although the signal at the ninth node N9 is at a low level, due to the influence of the threshold voltage of the transistor, the voltage of the signal at the ninth node N9 may be not low enough. Through the settings of the fourteenth transistor M14 and the second capacitor C2, when the second scan signal SP-OUT jumps from a high level to a low level, the potential of the tenth node N10 may be pulled low through the coupling of the second capacitor C2 such that the drain of the thirteenth transistor M13 may output the second clock signal XCK. At the same time, because the signal of the tenth node N10 may be at a very low low level and when the eighth node N8 is at a high level, the VGS of the eleventh transistor M11 may be too large, which may easily cause the failure of the eleventh transistor M11 after long-term operation. With the arrangement of the fourteenth transistors M14, when the signal of the tenth node N10 is at a very low level, the signal of the ninth node N9 may be at a regular low level, thereby reducing the voltage difference of the eleventh transistor M11. Referring to FIG. 1 and FIG. 16, in some embodiments, the tenth transistor M10 to the thirteenth transistor M13 may all be P-type transistors.

Specifically, in the second gating circuit 22 provided by the present disclosure, the tenth transistor M10 to the thirteenth transistor M13 may be all P-type transistors to avoid using N-type transistors to set up the second gating circuit 22. To reduce the leakage current, N-type transistors may usually use IGZO N-type transistors. IGZO N-type transistors may usually have the problem of low mobility. Therefore, IGZO N-type transistors need to be very large, which is not conducive to achieving narrow borders. At the same time, IGZO N-type transistor also has the problem of poor stability after long-term operation, which will cause the output capability of the transistor to weaken and even cause circuit failure. In the second gating circuit 22 provided by the present disclosure, the tenth transistor M10 to the thirteenth transistor M13 may be all P-type transistors, which may effectively improve the stability of the circuit while enabling split screen display.

Figure 19:
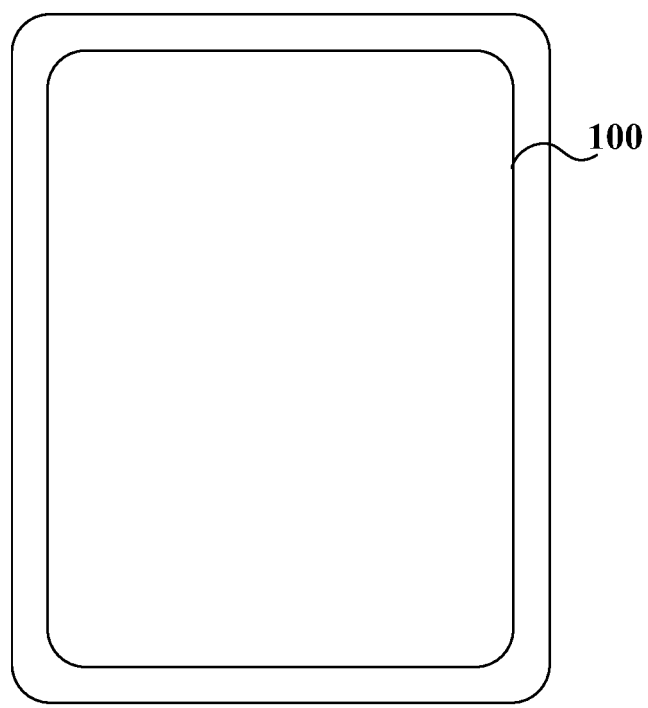
FIG. 19 illustrates an exemplary display device according to various disclosed embodiments of the present disclosure.

The present disclosure also provides a display device. FIG. 19 illustrates a schematic top view of an exemplary display device according to various disclosed embodiments of the present disclosure. As shown in FIG. 19, the display device 1000 may include a display panel 100. The display panel 100 may be a present disclosed display panel. FIG. 19 only takes a mobile phone as an example to illustrate the display device 1000. It can be understood that the display device 1000 provided by the present disclosure may also be a computer, a television, a vehicle-mounted display device, and other display devices 1000 with display functions. The display device 1000 provided by the embodiment of the present disclosure may include the beneficial effects of the display panel 100 provided by the embodiment of the present disclosure. For details, reference can be made to the specific description of the display panel 100 in the above embodiments, which will not be described again in this embodiment.

It can be seen from the above embodiments that the display panel and display device provided by the present disclosure at least achieve the following beneficial effects.

The display panel provided by the present disclosure may include a plurality of gating circuits. The gating circuits may correspond to shift registers, and the gating circuits may be electrically connected to the corresponding shift registers. The first input terminal of the gating circuit may be connected to the frequency cut signal. The frequency of the scanning signal may be controlled by adjusting the frequency cut signal such that the frequency of the scanning signal may be less than or equal to the frequency of the primary scanning signal. When the frequency of the scanning signals of each gating circuit in the display panel is equal to the frequency of the primary scanning signal, the refresh frequency of each area in the display panel may be same, and the display panel may perform a regular display. When the frequency of the scanning signal of a partial number of gating circuits in the display panel is equal to the frequency of the primary scanning signal, and the frequency of the scanning signal of a partial number of gating circuits is less than the frequency of the primary scanning signal, the display panel may achieve different refresh frequencies in different areas. That is, the display panel may perform a split-screen display. In the display panel provided by the present disclosure, switching between the conventional display and the split-screen display may be realized by adjusting the frequency switching signal, and the switching method may be relatively simple. At the same time, the refresh frequency of each portion in the display panel may be controlled by adjusting the frequency cut signal to enrich the functions of the display panel.

Although some specific embodiments of the disclosure have been described in detail by way of examples, those skilled in the art will understand that the above examples are for illustration only and are not intended to limit the scope of the disclosure. Those skilled in the art will understand that the above embodiments can be modified without departing from the scope and spirit of the disclosure. The scope of the disclosure is defined by the appended claims.

What is claimed is:

1. A display panel, comprising:
a driving circuit including a plurality of cascaded shift registers configured to generate a primary scanning signal;
a first display mode and a second display mode; and
a plurality of gating circuits corresponding to the plurality of shift registers, electrically connected to corresponding shift registers, and configured to generate a scanning signal,
wherein a first input terminal of a gating circuit of the plurality of gating circuits is connected to a frequency cut signal, the gating circuit is configured to control a frequency of the scanning signal in response to the frequency cut signal, and the frequency of the scanning signal is less than or equal to a frequency of the primary scanning signal,
wherein:
in the first display mode, in each display frame, a potential of the frequency cut signal is same; and
in the second display mode, in at least one display frame, the potential of the frequency cut signal jumps, and potentials of the frequency cut signals connected to at least two gating circuits of the plurality of gating circuits are different,
wherein:
the driving circuit includes a second driving circuit including a plurality of second shift registers connected in cascade and configured to generate a second primary scanning signal;
a second shift register of the plurality of second shift registers includes a fourth control module and a third output module electrically connected together;
the fourth control module receives the first voltage signal and responds to a first clock signal and a second clock signal to control a signal of a seventh node and a signal of the eighth node;
the third output module receives an input signal, the first voltage signal and the second voltage signal, and responds to the signal of the seventh node, the signal of the eighth node, the first clock signal and the second clock signal to control the second primary scanning signal;
the gating circuit includes a second gating circuit corresponding to the second shift register, electrically connected to the corresponding second shift register and configured to generate a second scanning signal; and
the second gating circuit receives the first voltage signal and controls the second scanning signal in response to the signal of the seventh node, the signal of the eighth node, the second clock signal and the frequency cut signal,
wherein:
the second gating circuit includes a fifth control module and a fourth output module;
the fifth control module responds to the frequency cut signal and the signal of the eighth node to control a signal of a ninth node; and
the fourth output module receives the first voltage signal and controls the second scanning signal in response to the signal of the seventh node, the signal of the ninth node and the second clock signal, and
wherein:
the fifth control module includes a tenth transistor and an eleventh transistor, a gate of the tenth transistor is connected to the frequency cutting signal, a source of the tenth transistor is electrically connected to the eighth node, a drain of the tenth transistor is electrically connected to the ninth node, a gate of the eleventh transistor is electrically connected to the eighth node, a source of the eleventh transistor is connected to the frequency cutting signal, and a drain of the eleventh transistor is electrically connected to the ninth node; and
the fourth output module includes a twelfth transistor and a thirteenth transistor, a gate of the twelfth transistor is electrically connected to the seventh node, and a source of the twelfth transistor is connected to the first voltage signal, a drain of the twelfth transistor is connected to the second scanning signal, a gate of the thirteenth transistor is electrically connected to the ninth node, a source of the thirteenth transistor is connected to the second clock signal, and a drain of the thirteenth transistor is connected to the second scanning signal.

2. The display panel according to claim 1, wherein:
the driving circuit includes a first driving circuit including a plurality of first shift registers connected in cascade and configured to generate a first primary scanning signal;
a first shift register of the plurality of first shift registers includes a first control module and a first output module that are electrically connected together;
the first control module receives an input signal, a first voltage signal and a second voltage signal, and responds to a first clock signal and a second clock signal to control a signal of a first node and a signal of a second node;
the first output module receives the first voltage signal and the second voltage signal, and controls the first primary scanning signal in response to the signal of the first node and the signal of the second node;
the gating circuit includes a first gating circuit corresponding to the first shift register, electrically connected to the corresponding first shift register, and configured to generate a first scanning signal; and
the first gating circuit receives the first voltage signal and the second voltage signal, and responds to the signal of the first node, the signal of the second node, the frequency cut signal and the first primary scan signal to control the first scanning signal.

3. The display panel according to claim 2, wherein:
the first gating circuit includes a second control module, a third control module and a second output module that are electrically connected together;
the second control module receives the first voltage signal, and responds to the frequency cut signal and the first primary scanning signal to control a signal of a third node;
the third control module receives the first voltage signal and the second voltage signal, and responds to the signal of the first node, the signal of the second node, the signal of the third node and the primary scanning signal to control a signal of a fourth node and a signal of a fifth node; and
the second output module receives the first voltage signal and the second voltage signal, and responds to the signal of the second node, the signal of the fourth node and the signal of the fifth node to control the first scanning signal.

4. The display panel according to claim 3, wherein:
the third control module includes a first sub-module and a second sub-module that are electrically connected together;
the first sub-module receives the first voltage signal and controls the signal of the fourth node in response to the signal of the first node, the signal of the third node and the first primary scanning signal; and
the second sub-module receives the first voltage signal and the second voltage signal, and controls the signal of the fifth node in response to the signal of the second node and the signal of the fourth node.

5. The display panel according to claim 4, wherein:
the second control module includes a first transistor, a gate of the first transistor is connected to the first primary scanning signal, a source of the first transistor is connected to the frequency cut signal, and a drain of the first transistor is electrically connected to the third node;
the first sub-module includes a second transistor and a third transistor, a gate of the second transistor is electrically connected to the third node, and a source of the second transistor is electrically connected to the first node, a drain of the second transistor is electrically connected to the fourth node, a gate of the third transistor is electrically connected to the first primary scanning signal, a source of the third transistor is connected to the first voltage signal, and a drain of the third transistor is electrically connected to the fourth node;
the second sub-module includes a fourth transistor and a fifth transistor, a gate of the fourth transistor is electrically connected to the fourth node, a source of the fourth transistor is connected to the first voltage signal, a drain of the fourth transistor is electrically connected to the fifth node, a gate of the fifth transistor is electrically connected to the second node, a source of the fifth transistor is connected to the second voltage signal, and a drain of the fifth transistor is electrically connected to the fifth node; and
the second output module includes a sixth transistor, a seventh transistor and an eighth transistor, a gate of the sixth transistor is electrically connected to the fourth node, a source of the sixth transistor is connected to the first voltage signal, a drain of the sixth transistor is connected to the first scanning signal, a gate of the seventh transistor is electrically connected to the second node, a source of the seventh transistor is connected to the second voltage signal, a drain of the seventh transistor is connected to the first scanning signal, a gate of the eighth transistor is electrically connected to the fifth node, a source of the eighth transistor is connected to the second voltage signal, and a drain of the eighth transistor is connected to the first scanning signal.

6. The display panel according to claim 5, wherein:
the second sub-module further includes a ninth transistor and a first capacitor, a gate of the ninth transistor is connected to the second voltage signal, a source of the ninth transistor is electrically connected to the fifth node, a drain of the ninth transistor is electrically connected to a sixth node, a first electrode of the first capacitor is electrically connected to the sixth node, and a second electrode of the first capacitor is connected to a first clock signal; and
a gate of the eighth transistor is electrically connected to the sixth node.

7. The display panel according to claim 5, wherein:
the first to eighth transistors are all P-type transistors.

8. The display panel according to claim 1, wherein:
the fifth control module also includes a fourteenth transistor and a second capacitor, a gate of the fourteenth transistor is connected to the second voltage signal, a source of the fourteenth transistor is connected to the ninth node, a drain of the fourteenth transistor is electrically connected to the tenth node, a first electrode of the second capacitor is electrically connected to the tenth node, and a second electrode of the second capacitor is electrically connected to the second scanning signal; and
the gate of the thirteenth transistor is electrically connected to the tenth node.

9. The display panel according to claim 1, wherein:
the tenth to thirteenth transistors are all P-type transistors.

10. The display panel according to claim 1, wherein:
the third output module includes a third sub-module and a fourth sub-module electrically connected together;
the third sub-module receives the first voltage signal and the second voltage signal, and controls the second primary scanning signal in response to the first clock signal and the signal of the seventh node; and
the fourth sub-module receives the input signal and the second voltage signal, and controls the second primary scanning signal in response to the first clock signal, the second clock signal and the signal of the eighth node.

11. The display penal according to claim 1, comprising:
a display area; and
a non-display area surrounding the display area,
wherein:
the display area includes multiple rows of pixel circuits;
the driving circuit and the multiple rows of pixel circuits are all located in the non-display area; and
in the driving circuit, shift registers in one level provides scanning signals for at least one row of the multiple rows of pixel circuits through gating circuits of the plurality of gating circuits electrically connected the shift registers.

12. A display device, comprising:
a display panel, including:
a driving circuit including a plurality of cascaded shift registers configured to generate a primary scanning signal;
a first display mode and a second display mode; and
a plurality of gating circuits corresponding to the plurality of shift registers, electrically connected to corresponding shift registers, and configured to generate a scanning signal,
wherein a first input terminal of a gating circuit of the plurality of gating circuits is connected to a frequency cut signal, the gating circuit is configured to control a frequency of the scanning signal in response to the frequency cut signal, and the frequency of the scanning signal is less than or equal to a frequency of the primary scanning signal,
wherein:
in the first display mode, in each display frame, a potential of the frequency cut signal is same; and
in the second display mode, in at least one display frame, the potential of the frequency cut signal jumps, and potentials of the frequency cut signals connected to at least two gating circuits of the plurality of gating circuits are different, wherein:
the driving circuit includes a second driving circuit including a plurality of second shift registers connected in cascade and configured to generate a second primary scanning signal;

a second shift register of the plurality of second shift registers includes a fourth control module and a third output module electrically connected together;

the fourth control module receives the first voltage signal and responds to a first clock signal and a second clock signal to control a signal of a seventh node and a signal of the eighth node;

the third output module receives an input signal, the first voltage signal and the second voltage signal, and responds to the signal of the seventh node, the signal of the eighth node, the first clock signal and the second clock signal to control the second primary scanning signal;

the gating circuit includes a second gating circuit corresponding to the second shift register, electrically connected to the corresponding second shift register and configured to generate a second scanning signal; and the second gating circuit receives the first voltage signal and controls the second scanning signal in response to the signal of the seventh node, the signal of the eighth node, the second clock signal and the frequency cut signal, wherein:
the second gating circuit includes a fifth control module and a fourth output module;

the fifth control module responds to the frequency cut signal and the signal of the eighth node to control a signal of a ninth node; and the fourth output module receives the first voltage signal and controls the second scanning signal in response to the signal of the seventh node, the signal of the ninth node and the second clock signal, and wherein:
the fifth control module includes a tenth transistor and an eleventh transistor, a gate of the tenth transistor is connected to the frequency cutting signal, a source of the tenth transistor is electrically connected to the eighth node, a drain of the tenth transistor is electrically connected to the ninth node, a gate of the eleventh transistor is electrically connected to the eighth node, a source of the eleventh transistor is connected to the frequency cutting signal, and a drain of the eleventh transistor is electrically connected to the ninth node; and the fourth output module includes a twelfth transistor and a thirteenth transistor, a gate of the twelfth transistor is electrically connected to the seventh node, and a source of the twelfth transistor is connected to the first voltage signal, a drain of the twelfth transistor is connected to the second scanning signal, a gate of the thirteenth transistor is electrically connected to the ninth node, a source of the thirteenth transistor is connected to the second clock signal, and a drain of the thirteenth transistor is connected to the second scanning signal.

* * * * *